United States Patent

Yano et al.

Patent Number: 6,096,434
Date of Patent: Aug. 1, 2000

[54] FILM STRUCTURE, ELECTRONIC DEVICE, RECORDING MEDIUM, AND METHOD FOR FORMING CONDUCTIVE OXIDE THIN FILMS

[75] Inventors: Yoshihiko Yano, Kanagawa; Takao Noguchi, Chiba, both of Japan

[73] Assignee: TDK Corporation, Tokyo, Japan

[21] Appl. No.: 09/044,227

[22] Filed: Mar. 19, 1998

[30] Foreign Application Priority Data

Jun. 30, 1997 [JP] Japan ..................... 9-189065

[51] Int. Cl.⁷ ........................................ B32B 9/04
[52] U.S. Cl. ................... 428/446; 428/700; 428/701; 428/702; 365/145; 117/944; 505/191
[58] Field of Search .................. 428/446, 700, 428/701, 702; 365/145; 117/944; 505/191

[56] References Cited

U.S. PATENT DOCUMENTS

| | | | |
|---|---|---|---|
| 5,753,934 | 5/1998 | Yano et al. | |
| 5,801,105 | 9/1998 | Yano et al. | 438/785 |
| 5,810,923 | 9/1998 | Yano et al. | 117/84 |
| 5,828,080 | 10/1998 | Yano et al. | 257/43 |
| 5,912,068 | 6/1999 | Jia | 428/210 |
| 5,919,515 | 7/1999 | Yano et al. | 427/126.3 |

FOREIGN PATENT DOCUMENTS 8-139292  5/1996  Japan .
8-195328  7/1996  Japan .

OTHER PUBLICATIONS

Yano, et al., "Epitaxial Growth and Dielectric Properties of BaTio, Films on Pt Electrode by Reactive Evaporation," J. Appl. Phys. 76 (12), Dec. 15, 1994, pp. 7833–7838.

Yano, et al., "Erratum: Epitaxial Growth and Dielectric Properties of BaTio, Films and Pt Electrodes by Reactive Evaporation," [J. Appl. Phys. 76, 7833 (1994)], J. Appl. Phys. 77 (11), Jun. 1, 1995, p. 6073.

Rosetti, Jr., et al., "Stress Induced Shift of the Curia Point in Epitaxial PbTio, Thin Films," Appl. Phys. Lett. 59 (20), Nov. 11, 1991, pp. 2524–2526.

*Primary Examiner*—Timothy M. Speer
*Assistant Examiner*—Bryant Young
*Attorney, Agent, or Firm*—Oblon, Spivak, McClelland, Maier & Neustadt, P.C.

[57] ABSTRACT

A film structure includes a conductive oxide thin film formed on a substrate having a silicon (100) face at its surface. The conductive oxide thin film is an epitaxial film composed mainly of strontium ruthenate. At least 80% of the surface of the conductive oxide thin film has a Rz of up to 10 nm. On the conductive oxide thin film having excellent surface flatness and crystallinity, a ferroelectric thin film, typically of lead zirconate titanate, having surface flatness and spontaneous polarization can be formed.

9 Claims, 12 Drawing Sheets

FILM STRUCTURE, ELECTRONIC DEVICE, RECORDING MEDIUM, AND METHOD FOR FORMING CONDUCTIVE OXIDE THIN FILMS

This invention relates to a film structure having a conductive oxide thin film, an electronic device comprising the film structure, and a recording medium utilizing the film structure. It also relates to a method for preparing a conductive oxide thin film by a multi-source evaporation technique.

The film structure finds use as electronic devices having ferroelectric films incorporated in semiconductor devices including non-volatile memories, infrared sensors, optical modulators, optical switches, and opto-electronic integrated circuits (OEIC) as well as recording media of the type wherein information is recorded by inducing polarization reversal in ferroelectric material by means of an atomic force microscope (AFM) probe etc.

BACKGROUND OF THE INVENTION

Electronic devices have been elaborated which are fabricated by forming superconducting, dielectric or ferroelectric films on silicon substrates or semiconductor crystal substrates, followed by integration. Attempts have been made to fabricate advanced devices by combining semiconductors with superconductors, dielectrics or ferroelectrics. For example, for the combination of semiconductors with superconductors, SQUID, Josephson devices, superconducting transistors, electromagnetic wave sensors and superconductor wired LSI are contemplated. For the combination of semiconductors with dielectric materials, LSIs having a higher degree of integration and dielectric isolated LSIs relying on SOI technology are contemplated. For the combination of semiconductors with ferroelectric materials, non-volatile memories, infrared sensors, optical modulators, optical switches and OEIC are contemplated.

To ensure optimum device characteristics and reproducibility thereof for these electronic devices, the superconducting, dielectric and ferroelectric materials used must be single crystals. With polycrystalline materials, it is difficult to provide good device characteristics on account of the disturbances of physical quantities by grain boundaries. The same applies to thin film materials. Epitaxial films which are as close to complete single crystals as possible are desired.

Aiming at the above application, engineers have made investigations on epitaxial films. Ferroelectric epitaxial films on MgO substrates are described in J. Appl. Phys., 76 (12), 15, 7833 (1994), for example.

It must be possible to integrate a semiconductor with a ferroelectric material before the technology can be applied to practical devices, although it is extremely difficult to incorporate a MgO substrate in a silicon device. It is also quite difficult to form a unidirectionally oriented ferroelectric thin film on a silicon single crystal substrate, for example, to form a (001) unidirectionally oriented $BaTiO_3$ film with good crystallinity on a silicon (100) substrate. In this regard, we proposed in Japanese Patent Application No. 217884/1996 a process for preparing an epitaxial thin film of ferroelectric material on a silicon single crystal substrate.

In general, when a thin film of ferroelectric material is formed on a silicon substrate, the properties of this ferroelectric thin film are significantly inferior to those estimated from the ferroelectric material itself. The properties of ferroelectric material, for example, dielectric constant, Curie temperature, coercive field, and remanent polarization, vary with the stress the ferroelectric material possesses. Since a thin film of ferroelectric material has a likelihood that stresses are produced during film formation, stress control becomes crucial in order to form a satisfactory ferroelectric thin film. The deterioration of properties of ferroelectric thin films on silicon substrates is largely attributable to the influence of stresses.

In J. Appl. Phys., 76 (12), 15, 7833 (1994) and Appl. Phys. Lett., 59 (20), 11, 2524 (1991), for example, it is reported that two-dimensional stresses within a film plane have a significant influence on ferroelectric properties although use is made of MgO single crystal substrates rather than silicon single crystal substrates. The main cause of stress generation is the difference in physical properties (e.g., coefficient of thermal expansion and lattice constant) between the underlying substrate and the ferroelectric material. Therefore, in order to apply ferroelectric thin films to devices, the stress must be controlled; otherwise, desirable ferroelectric properties are not consistently obtained.

Among ferroelectric materials having favorable properties, there are known lead family ferroelectric materials such as $PbTiO_3$, PLT ($PbTiO_3$ having La added thereto), PZT ($PbZrO_3$-$PbTiO_3$ solid solution), and PLZT ($PbZrO_3$-$PbTiO_3$ solid solution having La added thereto). Since most of the lead family ferroelectric materials have an axis of polarization in [001] direction, (001) unidirectionally oriented films are preferable from the standpoint of ferroelectric properties. However, we found through research works that when a lead family ferroelectric material thin film is formed on a silicon single crystal substrate, there is often formed a domain structure in which (001) oriented crystals and (100) oriented crystals are in admixture. By adjusting the composition, for example, by increasing the amount of La added in the case of PLT thin film, it is possible to avoid the frequent formation of the domain structure, but at the sacrifice of ferroelectric properties. Also in the case of PZT thin film which is often used as the superior ferroelectric material, the domain structure is likely to develop in the composition region where good ferroelectric properties appear, that is, where the atomic ratio of Ti/Zr is relatively high, rendering it quite difficult to form a unidirectionally oriented film. Thin films with such a domain structure have significantly lower ferroelectric properties than single crystals and also than when formed on MgO substrates.

For the following reason, it is difficult to form a unidirectionally oriented thin film of lead family ferroelectric material on a silicon single crystal substrate. In the following description, reference is made to PZT as a typical example of the lead family ferroelectric material. Both silicon and MgO have lower coefficients of thermal expansion than PZT. In particular, silicon has a coefficient of thermal expansion of $2.6 \times 10^{-6}/°$ C. which is significantly lower than that ($14 \times 10^{-6}/°$ C.) of MgO. Then, provided that a PZT thin film is formed at a temperature of 600° C., for example, the silicon substrate inhibits the PZT thin film from contracting in the course of cooling to room temperature after the film formation, causing a relatively high two-dimensional tensile stress to be produced in the PZT thin film within its plane. The film having such a high two-dimensional tensile stress undergoes a drop of spontaneous polarization. Tending to mitigate the tensile stress, the PZT film becomes a film of a mixture of (001) and (100) oriented crystals, which results in a significant drop of spontaneous polarization. Even if the PZT thin film becomes a (001) unidirectionally oriented film, the ferroelectric properties of this PZT thin film are inferior to those of a film of a (001) and (100) orientation mixture because of the presence of a substantial tensile stress in the PZT thin film.

In the recent years, as described in Appl. Phys. Lett., 68, 2358 (1996), research efforts have been made on ultrahigh density recording media wherein information is recorded by reversing the polarization of a ferroelectric material by means of an atomic force microscope (AFM) probe or the like.

The ferroelectric material undergoes polarization reversal at a certain threshold voltage. When such a ferroelectric material is used as a recording film, information is written therein by applying a pulse voltage to the ferroelectric film by means of an AFM probe or STM (scanning tunnel microscope) probe for aligning the polarization of only the probed region in one direction or reversing the polarization. For information read-out, the piezoelectric effect, pyroelectric effect, electro-optical effect and current detection upon polarization reversal of the ferroelectric material can be utilized.

The AFM or STM has a resolution of the atomic level. The ferroelectric material incurs polarization reversal at a high speed of 100 ns or less and permits record bits to be formed to a diameter of 10 nm or less. Then a high density memory with a capacity of about $10^6$ megabits/cm$^2$ can be realized if record bits are formed as zones of 10 nm×10 nm, for example.

As the aforementioned ferroelectric media for AFM or STM memories, structures having a conductive layer formed on a substrate and a polycrystalline ferroelectric thin film formed thereon have been used. In the media using a polycrystalline ferroelectric thin film, crystal grain boundaries, domains and surface irregularities of the ferroelectric thin film produce noise.

Since the distance between the probe and the medium in the AFM or STM memory is of the order of nanometers, the memory medium is also required to have a surface which is flat or uniform on the order of nanometers. Uniformity is important with respect to surface irregularities, crystallinity, domains, and surface-trapped charges. Since the position of the probe relative to the recording medium is controlled by means of an actuator when addressing a record bit for writing and reading, the correct reading of the relevant bit is prohibited or high speed operation is prevented if the uniformity with respect to surface topography, crystallinity, domains, and surface-trapped charges is poor. If the flatness of the medium is poor, the noise caused by surface irregularities, crystallinity, domains, and surface-trapped charges is contained into the record bit signal. The prior art media using ferroelectric thin films are insufficient in surface uniformity, and media having a surface which is uniform on the order of nanometers have not been realized.

From the standpoint of realizing a fully flat recording medium, flatness on the molecular level is accomplished if a ferroelectric material is formed on a substrate as an epitaxial film. In preparing this ferroelectric medium, however, a ferroelectric film must be formed on a substrate having a conductive thin film already formed thereon. On the conductive thin film having poor flatness, a ferroelectric thin film having a fully flat surface cannot be formed. In order that the ferroelectric material be formed in the form of an epitaxial film, the conductive thin film must have a crystal lattice matched with the ferroelectric material.

Moreover, as previously described, the ferroelectric material used herein should be formed on silicon substrates for practical application, and its ferroelectric properties should not be deteriorated by stresses, domain formation or the like.

Therefore, for ultra-high density recording media of the type that information is recorded by inducing polarization reversal in the ferroelectric material by means of an AFM probe, not only a conductive thin film having a crystal lattice matched with the ferroelectric material, high crystallinity and high surface flatness, but also a ferroelectric thin film having excellent ferroelectric properties which are not deteriorated by stresses, domain formation or the like are necessary. Additionally, the conductive thin film and the ferroelectric thin film of the above-mentioned quality must be realized on silicon substrates which are practical substrates. However, film structures having such thin films have never been available.

It is disclosed in Japanese Patent Application No. 245642/1996 by TDK Corporation, for example, that a ferroelectric film having improved flatness is obtained by depositing a ferroelectric material on a conductive thin film of platinum. The ferroelectric thin film formed on the platinum thin film has satisfactory flatness in relatively short periodicity, but a further improvement in flatness in relatively long periodicity is needed.

As mentioned above, when a ferroelectric thin film, especially PZT thin film is formed on a silicon single crystal substrate, the film does not have a sufficient spontaneous polarization because a substantial two-dimensional tensile stress is left within film plane. Further, a flat conductive thin film cannot be formed on the silicon single crystal substrate.

SUMMARY OF THE INVENTION

In order to form a ferroelectric thin film, typically a PZT thin film, having a flat surface and a satisfactory spontaneous polarization on a silicon single crystal substrate, the invention aims to form on the silicon single crystal substrate a conductive thin film having sufficiently improved surface flatness to enable formation thereon of the ferroelectric thin film and a capability to control the stress produced in the ferroelectric thin film. If a ferroelectric thin film having a satisfactory spontaneous polarization can be formed on a silicon single crystal substrate which is a semiconductor, it is quite useful in various applications including non-volatile memories, infrared sensors, optical modulators, optical switches, and OEIC. In particular, if a conductive thin film and an overlying ferroelectric thin film can be realized both to high surface flatness, they are useful for application as recording media utilizing polarization reversal.

In a first aspect, the present invntion provides a film structure comprising a substrate having a silicon (100) face at its surface and a conductive thin film of oxide formed on the substrate and having a surface. The conductive oxide thin film is an epitaxial film composed mainly of strontium ruthenate. At least 80% of the surface of the conductive oxide thin film has a ten point mean roughness Rz of up to 10 nm across a reference length of 5,000 nm.

Preferably, the conductive oxide thin film contains strontium, ruthenium and oxygen, and $F_{(Sr/Ru)}$ representative of an atomic ratio Sr/Ru in the film ranges from 0.91 to 0.97.

The film structure may further include a subbing thin film between the substrate and the conductive oxide thin film. The subbing thin film has a perovskite crystal structure and assuming (001) unidirectional orientation when it is tetragonal and (100) unidirectional orientation when it is cubic. Tyically, the subbing thin film is composed mainly of barium titanate.

The film structure may further include an intermediate thin film between the substrate and the conductive oxide thin film. The intermediate thin film is comprised of a zirconium oxide base thin film which is composed mainly of zirconium oxide or zirconium oxide stabilized with a rare earth element inclusive of scandium and yttrium and which assumes (001) unidirectional orientation when it is tetragonal or monoclinic and (100) unidirectional orientation when it is cubic.

The film structure may further include a ferroelectric thin film on the conductive oxide thin film. The ferroelectric thin film is preferably constructed of lead zirconate titanate.

Also contemplated herein are an electronic device comprising the film structure defined above and a recording medium comprising the film structure defined above.

In a second aspect, the invention provides a method for preparing a conductive oxide thin film of oxide containing at least strontium and ruthenium on a substrate by a multi-source evaporation process, comprising the steps of placing strontium metal and ruthenium metal as sources in a vacuum chamber, and evaporating the sources in the chamber while introducing an oxidizing gas therein, thereby depositing the metals on the substrate. The strontium and ruthenium metals are supplied from the sources in such rates that $E_{(Sr\ Ru)}$ representative of an atomic ratio Sr/Ru may range from 0.75 to 0.95. In the evaporating step, the substrate is preferably heated at a temperature of 800 to 1,100° C. The method is applicable to the preparation of the film structure defined above.

According to the invention, a conductive oxide thin film, especially having good flatness in long periodicity, can be formed on a silicon substrate. Utilizing this conductive oxide thin film, the overlying epitaxial ferroelectric thin film can be controlled such that the crystal lattice thereof may be distorted so as to stretch the spacing between crystal faces parallel to the film or be substantially free of distortion. As a result, the ferroelectric thin film is obtained as a (001) unidirectionally oriented film which does not assume the domain structure, enabling to increase the spontaneous polarization of the ferroelectric thin film or to prevent the spontaneous polarization from lowering, and at the same time, to improve the surface flatness.

Next, the function and benefits of the invention will be described in further detail on the basis of the theoretical study and experimental data. For the theoretical study on lead family ferroelectric materials, reference is now made to $PbTiO_3$ because it is a simple compositional system and its physical properties are well known. The same discussion applies to other lead family ferroelectric materials.

First consideration is made on the spontaneous polarization property in bulk single crystal of a ferroelectric material. The ferroelectric material of interest is $PbTiO_3$. $PbTiO_3$ crystal is a tetragonal crystal having an a-axis lattice constant of 0.3904 nm and a c-axis lattice constant of 0.4152 nm at room temperature and possesses an axis of polarization in [001] direction. The spontaneous polarization Ps of this crystal exerted when a two-dimensional stress is generated therein in an in-plane direction parallel to c-face of the lattice is calculated using Devonshire thermodynamic equation, and the results are shown in FIG. 1. In the graph, a two-dimensional stress with a minus symbol represents a compressive stress, and a stress with a plus symbol represents a tensile stress. It is evident from this graph that the spontaneous polarization increases with an increase of two-dimensional compressive stress and decreases with an increase of two-dimensional tensile stress.

Next, a $PbTiO_3$ thin film expitaxially grown on a silicon substrate is considered. Provided that a single crystal thin film of (001) orientation is obtained when the thin film forming temperature is 600° C., the c-face of $PbTiO_3$ crystal lattice is positioned parallel to the crystal face appearing at the substrate surface. Since $PbTiO_3$ and silicon have different coefficients of thermal expansion, two-dimensional stresses are produced in-plane in the $PbTiO_3$ thin film, in the course of cooling from the film forming temperature to room temperature. Silicon has a coefficient of thermal expansion of $2.6 \times 10^{-6}$/° C., in accordance with which the silicon substrate surface undergoes two-dimensional contraction in the course of cooling from 600° C. to room temperature. On the other hand, the $PbTiO_3$ thin film also contracts concomitant with the contraction of the silicon substrate surface, and the contractions occurring at this point in the $PbTiO_3$ crystal in a-axis and b-axis directions are significantly less as compared with the contraction occurring in accordance with the coefficient of thermal expansion of $PbTiO_3$. This is because the coefficient of thermal expansion of silicon is significantly lower than that of $PbTiO_3$. As a consequence, a tensile stress is left in the $PbTiO_3$ thin film after cooling.

Since a two-dimensional tensile stress is produced in-plane in the $PbTiO_3$ thin film formed on the silicon substrate as mentioned above, it is seen from FIG. 1 that its spontaneous polarization becomes lower than that of a bulk single crystal. Actually, the $PbTiO_3$ thin film becomes a film of mixed (001) and (100) oriented crystals since it tends to relax the tensile stress.

An object of the invention is to prevent ferroelectrics such as $PbTiO_3$ and PZT from lowering their spontaneous polarization when they are formed into thin films. To attain this object, the invention intends to reduce to a low level or substantially zero the tensile stress that is produced in the ferroelectric thin film due to the difference in coefficient of thermal expansion between the thin film and the substrate. This prevents the deterioration of spontaneous polarization. Moreover, the invention can even produce a compressive stress in the ferroelectric thin film, thereby increasing the spontaneous polarization.

Specifically, the stress control in the ferroelectric thin film according to the invention is carried out by forming a conductive oxide thin film between the silicon single crystal substrate and the ferroelectric thin film. This conductive oxide thin film serves not only as a buffer layer allowing for epitaxial growth of the ferroelectric thin film, but also as an electrode layer. The description is continued by referring to an example using PZT as the ferroelectric and $SrRuO_3$ as the conductive oxide thin film-forming material.

First, consideration is made on an example wherein a PZT (001) thin film is epitaxially grown on a substrate in the form of a Si(100)/$SrRuO_3$(001) layer structure in which a $SrRuO_3$ thin film is epitaxially grown on a silicon (100) single crystal. Provided that the substrate temperature at which the PZT thin film is formed is 600° C., the PZT bulk body wherein PZT has the composition $Pb(Ti_{0.4}Zr_{0.6})O_3$ has an a-axis lattice constant of 0.409 nm at 600° C. On the other hand, $SrRuO_3$ is essentially a crystal of $GdFeO_3$ type and has lattice constants, a=0.553 nm, b=0.557 nm, and c=0.785 nm. However, the lattice converts to a pseudo-cubic perovskite structure as a result of thin film formation and due to the stress and other effects associated therewith. The pseudo-cubic perovskite structure has an a-axis lattice constant ($a_{pc}$) of 0.396 nm at 600° C. Then, there is a misfit in lattice constant between the PZT thin film and the $SrRuO_3$ thin film during film formation.

The general deformation pattern of a thin film crystal lattice developed when there is a misfit between a substrate and an epitaxially grown thin film is described with reference to FIG. 2. FIG. 2(a) illustrates a situation wherein the substrate and the thin film are independent systems; FIG. 2(b) illustrates a situation wherein the thin film accommodates the misfit by elastic distortion; FIG. 2(c) illustrates a situation wherein the thin film accommodates the misfit by dislocation. In FIG. 2(b), the crystal lattice of the thin film is stretched in the c-axis direction and contracted in the a-axis and b-axis directions. Specifically in this state, a two-dimensional compressive stress is produced in the crystal lattice of the thin film. The state of FIG. 2(b) develops when the film is relatively thin. If the misfit is completely accommodated by the dislocation as shown in FIG. 2(c), the thin film becomes a stressless thin film having the same lattice constant as the film of FIG. 2(a). The state of FIG. 2(c) develops when the film is relatively thick.

In this way, the PZT thin film having a misfit of lattice constant with the substrate (Si/SrRuO$_3$) is either in the state that a two-dimensional compressive stress is present (where the misfit is accommodated by elastic distortion) or in the stressless state (where the misfit is accommodated by dislocation) when it is maintained at the film forming temperature. As described above, in the course of cooling from the film forming temperature to room temperature, a force to produce a two-dimensional tensile stress is exerted in the PZT thin film due to the substantial difference in coefficient of thermal expansion between silicon and PZT. As a result, if the film is in the stressless state as shown in FIG. 2(c) at the film forming temperature, the film eventually receives a tensile stress at room temperature to reduce spontaneous polarization. Conversely, if the film is in the compressive stressed state as shown in FIG. 2(b) at the film forming temperature, the development of a tensile stress concomitant with cooling can be canceled.

Then, according to the invention, with the low coefficient of thermal expansion of the silicon single crystal substrate borne in mind, the conductive oxide thin film and the ferroelectric thin film are selected in such a proper combination as to optimize the misfit of lattice constant between the conductive oxide thin film and the ferroelectric thin film at the film forming temperature, and specifically to provide the state of FIG. 2(b). With this selection, the compressive stress produced in the ferroelectric during film formation can be adjusted to a sufficient value to cancel the influence of the silicon single crystal substrate upon cooling. There can be realized on the silicon substrate a ferroelectric thin film which assumes a substantially stressless state or a compressive stressed state at room temperature. Then the invention enables a PZT thin film to be formed on the silicon single crystal substrate as a (001) oriented epitaxial film. Accordingly, the invention enables that a ferroelectric thin film having a significantly great spontaneous polarization be formed on a silicon single crystal substrate which is quite useful in device applications.

In contrast, in the prior art known combination of a MgO substrate with a ferroelectric thin film, the difference in coefficient of thermal expansion therebetween is noticeably small as compared with the use of the silicon substrate. On account of this, it is unnecessary that the degree of misfit between the substrate and the ferroelectric thin film at the film forming temperature is limited, with the difference in shrinkage therebetween in the course of cooling from the film forming temperature taken into account. In fact, no such proposals have heretofore been made.

Where the film is formed relatively thick, it is likely that dislocation will occur and hence, the compressive stress caused by a misfit be relaxed. In the event of a MgO substrate, even if the compressive stress caused by a misfit is somewhat relaxed by more or less dislocation occurring at the film forming temperature, no substantial tensile stress is produced after cooling to room temperature because the tensile stress produced during cooling is low. Therefore, when the MgO substrate is used, no substantial tensile stress is eventually produced even under the condition that the ferroelectric thin film is thick and likely to induce dislocation. In contrast, the present invention uses a silicon substrate so that the contraction of the substrate upon cooling produces a substantial tensile stress. Accordingly, a substantial compressive stress must have been produced during film formation.

Because the compressive stress built up in the ferroelectric thin film due to the misfit is relaxed with more difficulty as the ferroelectric thin film becomes thin, the ferroelectric thin film should preferably be thin in order to cancel the influence of the silicon single crystal substrate upon cooling. Since the thin ferroelectric thin film, however, is likely to be affected by the surface topography of the underlying conductive oxide thin film, the conductive oxide thin film must be improved in surface flatness. This requirement is met according to the invention by using a strontium ruthenate thin film because the strontium ruthenate thin film, when formed on the surface of a silicon single crystal substrate, offers sufficiently improved surface property to ensure flatness on the molecular level to a thin ferroelectric thin film to be formed thereon.

It has been additionally found that on the strontium ruthenate thin film, the relaxation of the misfit by dislocation is unlikely to occur even in a relatively thick ferroelectric thin film, and that the thickness of the ferroelectric thin film has a less influence on the buid-up of compressive stress. This effect is realized because the strontium ruthenate thin film has so excellent surface flatness that dislocation is unlikely to occur at the interface between the ferroelectric thin film and the strontium ruthenate thin film, allowing a ferroelectric thin film having higher completeness to epitaxially grow. This effect is also realized because both the ferroelectric thin film and the strontium ruthenate thin film are perovskite oxides (the strontium ruthenate thin film is of the pseudo-cubic perovskite structure as previously mentioned), and the crystal lattice undergoes elastic deformation to accumulate stress, more specifically the crystal lattice undergoes elastic deformation to accumulate stress without dislocation even when the plastic deformation limit is high, that is, when a substantial stress is produced due to the misfit or the difference in coefficient of thermal expansion.

By virtue of these mechanisms, the invention is successful in realizing on a silicon substrate a ferroelectric thin film which is in a substantially stressless state at room temperature or a ferroelectric thin film which is compressive stressed at room temperature. Then, according to the invention, a PZT thin film, for example, can be formed on a silicon single crystal substrate as a (001) oriented epitaxial film.

An attempt to improve the properties of a dielectric thin film by controlling the film stress during film formation is described, for example, in JP-A 195328/1996. The capacitor dielectric film of JP-A 195328/1996, in one example, includes a capacitor electrode and a thin film of paraelectric perovskite crystals wherein the crystal lattice is distorted such that the spacing between crystal faces in a direction parallel to the interface between the dielectric film and the capacitor electrode becomes longer. In another example, the capacitor dielectric film includes a capacitor electrode and a thin film of ferroelectric perovskite crystals wherein the crystal lattice is distorted such that the same spacing between crystal faces becomes shorter. That is, JP-A 195328/1996 sets forth that a compressive stress is produced within film plane in the case of a paraelectric thin film, and a tensile stress is produced within film plane in the case of a ferroelectric thin film. The development of a tensile stress in ferroelectrics increases the dielectric constant, but reduces the spontaneous polarization. JP-A 195328/1996 aims to increase the dielectric constant for the intended application to normal DRAM, but does not aim to increase the spontaneous polarization for the application to ferroelectric memories.

In JP-A 195328/1996, several examples using silicon single crystal substrates are described. The dielectric film is (001) oriented only in the sixth example wherein a Pt (001) film is deposited on a MgO (001) film, and a dielectric film of $KTaO_3$ is formed thereon.

The attempt to improve the properties of a ferroelectric thin film by controlling the stress is also described in JP-A 139292/1996. claim 1 of JP-A 139292/1996 is a thin film capacitor comprising a conductive substrate of a conductive material in which at least the surface has a tetragonal (001) face or a cubic crystal structure, a dielectric film epitaxially grown on the conductive substrate from a dielectric material having a perovskite crystal structure belonging to a tetragonal or cubic system, and an upper electrode formed on the dielectric film. The dielectric material essentially has a Curie temperature of up to 150° C. The lattice constant ad inherent to the dielectric material represented by the a-axis length of the perovskite crystal structure and the lattice constant $a_s$ inherent to the dielectric material represented by the a-axis length of the tetragonal or cubic crystal structure satisfy the relationship: $1.002 \leq a_d/a_s \leq 1.015$. Claim 7 of JP-A 139292/1996 is a thin film capacitor comprising a first electrode, a dielectric film epitaxially grown on the first electrode from a dielectric material having a tetragonal or hexagonal perovskite crystal structure, and an upper electrode formed on the dielectric film. The dielectric film has a thickness of at least 15 nm. The c-axis length $C_e$ of the dielectric material as epitaxially grown and the tetragonal c-axis length or hexagonal a-axis length $C_0$ (corresponding to the c-axis length $C_e$) inherent to the dielectric material prior to epitaxial growth satisfy the relationship: $C_e/C_0 \geq 1.02$.

The thin film capacitor of JP-A 139292/1996 has a ferroelectric thin film in which the lattice having a perovskite crystal structure are contracted along the a-axis and stretched along the c-axis, respectively, as described in the Function Section. The benefits are that remanent polarization and its temperature dependency are improved.

In order to produce such a ferroelectric thin film, JP-A 139292/1996 uses the following procedure. A single crystal silicon layer is formed on an insulating layer (silicon oxide layer) formed on the surface of a silicon substrate, and a ferroelectric thin film is formed thereon via a barrier layer of nickel silicide or the like or a lower electrode of Pt or the like. The single crystal silicon layer is formed by one method of directly selectively growing a single crystal silicon layer or another method of first selectively growing an amorphous silicon layer and then annealing the layer to convert it into a single crystal through solid phase growth from its interface with the silicon substrate.

However, in our follow-up test, silicon single crystal layers having excellent surface property could not be formed by either of the methods described in JP-A 139292/1996, and therefore, ferroelectric thin films having excellent crystallinity could not be formed thereon. Yet the c-axis length ratio $(C_e/C_0)$ recited in claim 7 of JP-A 139292/1996 could not be realized. Among the Examples in JP-A 139292/1996, the c-axis length ratio is described only in the Examples using oxide substrates such as MgO.

Among the Examples in JP-A 139292/1996, the use of silicon single crystal substrates is described only in Examples 7, 8 and 9. In Example 7, a TiN film of 400 nm thick was formed on a silicon single crystal substrate, a $Ca_{0.5}Y_{0.5}TiO_3$ film of 200 nm thick was formed thereon as a lower electrode, and a $Ba_{0.5}Sr_{0.5}TiO_3$ dielectric film of 200 nm thick was formed thereon. In Example 8, the thickness of the dielectric film was changed to 100 nm. In Example 9, the composition of the dielectric film was changed to $Ba_{0.45}La_{0.05}Sr_{0.5}TiO_3$. In these Examples, the lower electrode and the dielectric film were amorphous at the points of time when the respective films were formed, and they were converted into single crystals by annealing at 700° C. for 1 minute using an IR lamp annealing equipment. Unlike the method of sequentially epitaxially growing thin films from the side of a silicon single crystal substrate to eventually form a single crystal ferroelectric thin film according to the present invention, the method of forming a multilayer structure of amorphous films followed by annealing cannot utilize the above-described misfit. Therefore, the method of JP-A 139292/1996 utilizing annealing is deemed difficult or impossible to form a ferroelectric thin film in single crystal form. In fact, the c-axis length ratio is not described in Examples 7 to 9 and the formation of a unidirectionally oriented film is not described.

Understandably, unlike the prior art technique of controlling the stress in a ferroelectric thin film on a MgO substrate, the present invention is successful in establishing a (001) unidirectionally oriented film not assuming the domain structure, by forming a conductive oxide thin film having high flatness on a silicon substrate and forming an epitaxial ferroelectric thin film thereon. By utilizing the conductive oxide thin film, the crystal lattice in the epitaxial ferroelectric thin film is distorted such that the spacing between crystal faces parallel to the film is stretched or kept in a substantially strainless state. The invention enables to increase the spontaneous polarization of the ferroelectric thin film or to prevent the spontaneous polarization from lowering and at the same time, to make the surface flat. These results could not realized by the prior art methods.

Moreover, according to the invention, other functional films such as superconducting thin films may be formed on the conductive oxide thin film as well as the ferroelectric thin films. Where a superconducting thin film is formed, for example, it is a flat thin film experiencing minimal deterioration by stresses as in the case of the ferroelectric thin film, achieving improved superconducting properties.

The film structure of the invention performs well in various applications such as non-volatile memories, IR sensors, optical modulators, optical switches, OEIC and recording media utilizing polarization reversal.

BRIEF DESCRIPTION OF THE DRAWINGS

These and further features of the present invention will be apparent with reference to the following description and drawings, wherein.

DESCRIPTION OF THE PREFERRED EMBODIMENTS

Figure 1:
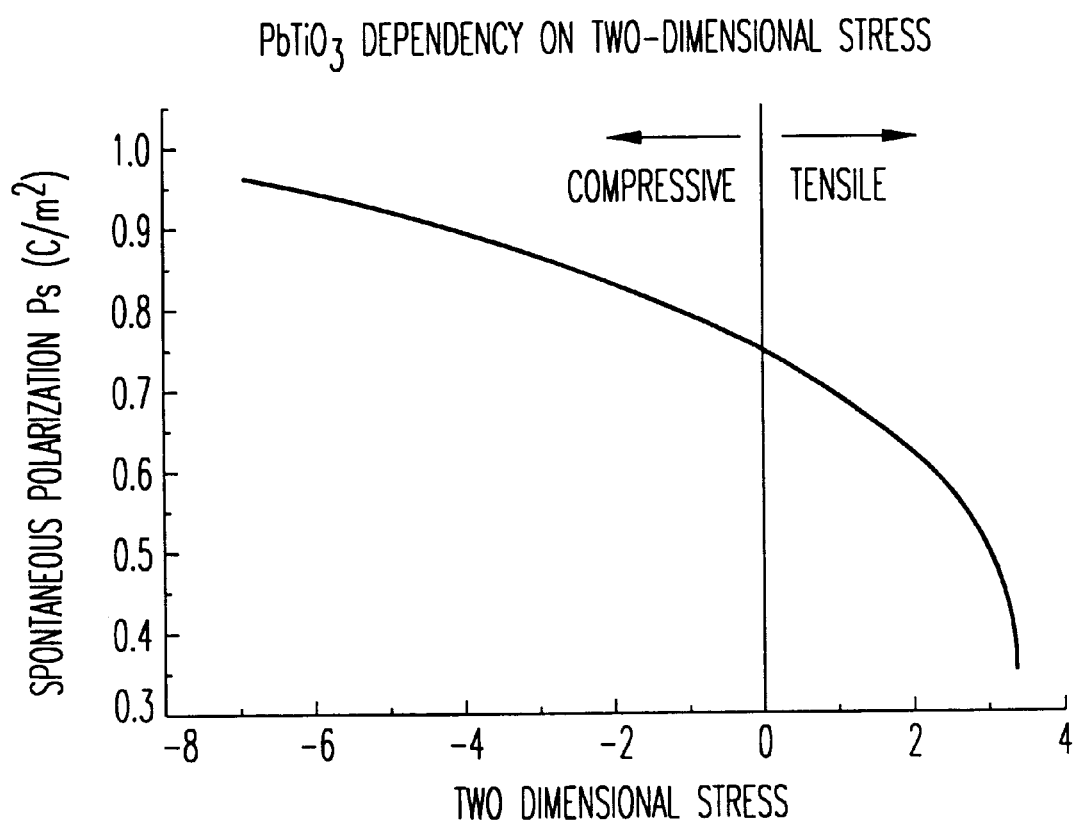
FIG. 1 is a graph showing the spontaneous polarization Ps relative to two-dimensional stress of a ferroelectric thin film ($PbTiO_3$).
Figure 2A:
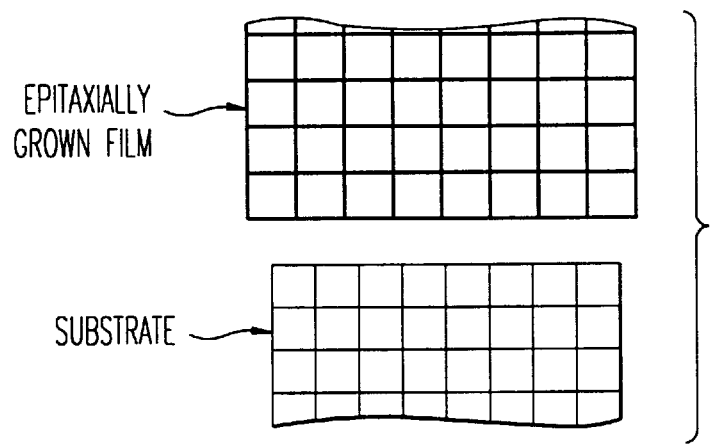
FIG. 2 schematically illustrates the patterns of deformation of a thin film crystal lattice developed when there is a misfit between a substrate and a thin film epitaxially grown thereon.
Figure 2B:
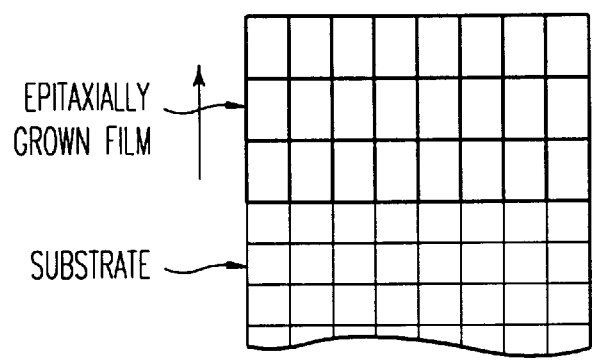
Figure 2C:
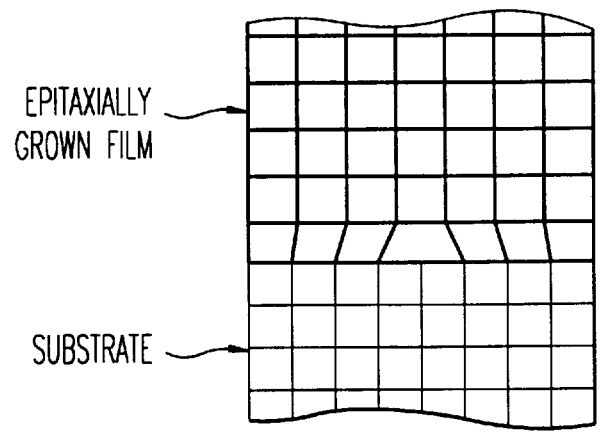

The film structure of the invention is defined as comprising at least a silicon substrate and a conductive oxide thin film formed on one surface of the substrate. In one preferred embodiment, an intermediate thin film and/or a subbing thin film is disposed between the substrate and the conductive oxide thin film. They are preferably stacked in the order of substrate, intermediate thin film, subbing thin film, and conductive oxide thin film. A ferroelectric thin film is formed on the conductive oxide thin film in close contact therewith. The thin films and the preparation thereof are described below as well as the substrate.

Substrate

The material of the substrate is used such that a (100) face of silicon single crystal becomes the substrate surface.

Conductive oxide thin film

The conductive oxide thin film included in the film structure of the invention is composed mainly of strontium ruthenate (abbreviated as SRO, hereinafter). The conductive oxide thin film serves as a buffer crystal that permits a ferroelectric thin film or another functional film such as a superconducting thin film to form thereon as an epitaxial film and at the same time, it can be utilized as an electrode layer.

Preferably the conductive oxide thin film has a resistivity of $10^{-5}$ to $10^{-2}$ Ωcm in bulk and yet, a resistivity of $10^{-5}$ to $10^{-2}$ Ωcm in thin film form.

The conductive oxide thin film is an epitaxial film and a (001) unidirectionally oriented film. Since the (001) face of SRO becomes the thin film surface, flatness on the molecular level is available. When a ferroelectric thin film is formed thereon, it relies on crystal growth with (001) orientation. The ferroelectric thin film of (001) orientation has an axis of polarization in a direction perpendicular to the substrate surface, which is advantageous for devices using this thin film structure.

The term "epitaxial film" used herein requires, in the first place, that it be a unidirectionally oriented film. The unidirectionally oriented film, in turn, designates a film in which as measured by x-ray diffractometry, the peak intensity of reflection on faces other than the objective crystal face is up to 10%, preferably up to 5% of the maximum peak intensity of reflection on the objective crystal face. Illustratively stated, a (001) unidirectionally oriented or c-face unidirectionally oriented film, for example, is a film having an intensity of reflection other than on (00 l) face which is up to 10%, preferably up to 5% of the maximum peak intensity of reflection on (00 l) face as analyzed by 2θ-θ x-ray diffraction (XRD). It is noted that the (00 l) face generally designates those equivalent faces such as (001) and (002) faces. In the second place, the term "epitaxial film" requires that crystals be oriented in alignment in all the directions of X, Y, and Z axes, provided that the film surface is a X-Y plane and the film's thickness direction is Z axis. This orientation is confirmed by a spotty or streaky pattern as analyzed by RHEED. If these requirements are met, then this film is regarded to be an epitaxial film. It is understood that RHEED is an abbreviation of reflection high energy electron diffraction and the RHEED analysis is an index of the orientation of a crystal axis within a film plane.

As the buffer crystal, the conductive oxide thin film should preferably have good crystallinity and a flat surface (which is regarded flat by molecular level analysis), for the purpose of improving the crystallinity of a functional film to be formed thereon such as a ferroelectric thin film.

The crystallinity of a thin film can be evaluated in terms of the half-value width of a rocking curve of reflection peak in x-ray diffractometry (XRD) and the pattern of a RHEED image. The surface flatness can be evaluated in terms of streakiness of a RHEED image and surface roughness (ten point mean roughness) as measured by AFM.

Preferably, the conductive oxide thin film has such crystallinity that a rocking curve of reflection on a (002) face upon x-ray diffraction has a half-value width of up to about 1.50°. Also preferably, the surface roughness (ten point mean roughness) Rz as measured by AFM across a reference length of 5,000 nm is up to 10 nm, especially up to 5 nm. It is desired that such a surface roughness be available over a region accounting for at least 80%, more preferably at least 90%, especially at least 95% of the surface of the thin film. The above-described surface roughness is a value obtained by carrying out measurement at arbitrary 10 or more points evenly distributed over an area of at least 10 cm of a thin film formed over the entire surface of a substrate. The requirement of the invention that at least 80% of the surface of the thin film have a Rz of up to 10 nm means that when measurement is made at more than 10 points as described above, Rz is up to 10 nm at 80% or more of the measured points. It is noted that the surface roughness Rz is prescribed in JIS B-0610.

With respect to the half-value width of a rocking curve and Rz, no particular lower limit values need be determined while smaller values are preferred. At the present, the lower limit of the half-value width of a rocking curve is about 0.7°, especially about 0.4° and the lower limit of Rz is about 0.10 nm.

Also, a RHEED image which is streaky and sharp indicates that the relevant thin film has improved crystallinity and surface flatness.

By controlling the composition of conductive oxide thin film as will be described later, a conductive oxide thin film having surface flatness on the molecular level can be realized on the silicon substrate.

SRO is an oxide containing strontium (Sr) and ruthenium (Ru), generally in a ratio of Sr:Ru:O=1:1:3, and has a pseudo-cubic perovskite crystal structure. Since oxygen defects or excessive oxygen is usually present in SRO, the ratio of O to Ru often ranges from about 2.7/1 to about 3.3/1.

Figure 3:
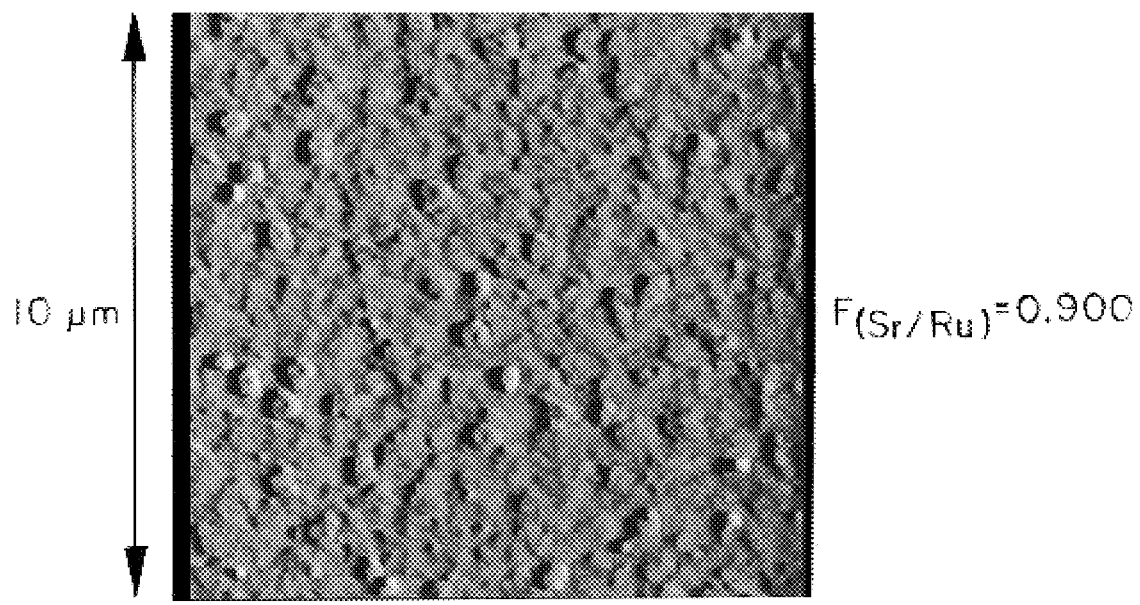
FIGS. 3, 4 and 5 are photographic images through AFM of a SRO thin film showing the relationship of an atomic ratio Sr/Ru, $F_{(Sr/Ru)}$, to surface property, with $F_{(Sr/Ru)}$=0.900, 0.935 and 1.235 in FIGS. 3, 4 and 5, respectively.
Figure 4:
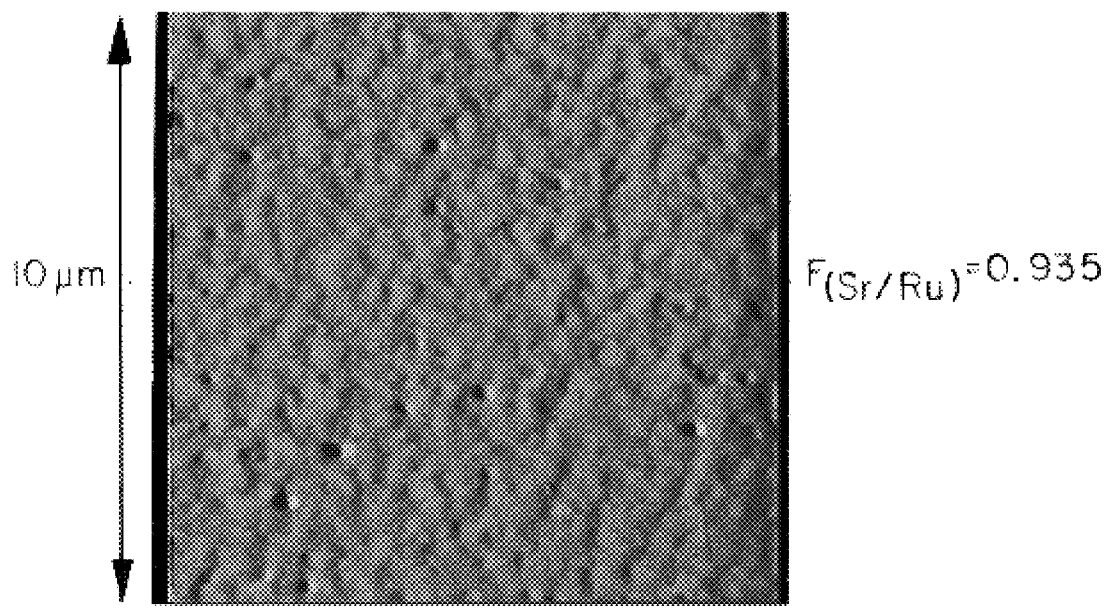
Figure 5:
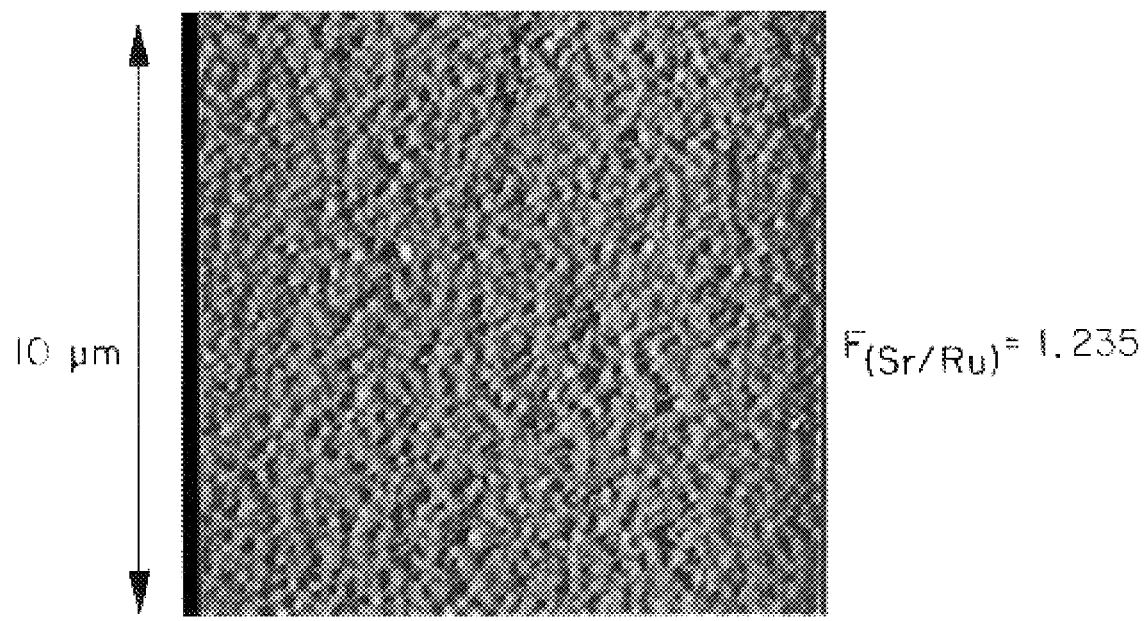
Figure 6:
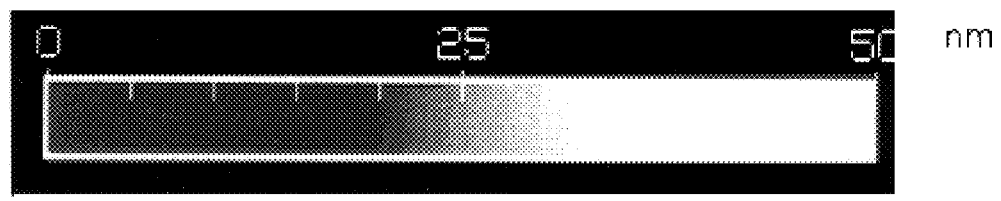
FIG. 6 is a density scale for evaluating the topography of the SRO thin film surface in the AFM images of FIGS. 3 to 5.

In the conductive oxide thin film of SRO, the atomic ratio Sr/Ru, represented by $F_{(Sr/Ru)}$, hereinafter, preferably ranges from 0.91 to 0.97, more preferably from 0.92 to 0.96, most preferably from 0.93 to 0.95. FIGS. 3 to 5 show how the surface flatness of a SRO thin film varies with $F_{(Sr/Ru)}$. These figures are AFM images of conductive oxide thin films. FIG. 6 is a variable density scale indicating the degree of irregularity in the respective figures. From these figures, it is seen that a flat surface is obtained when $F_{(Sr/Ru)}$ has a value of about 0.94. The thin film becomes poor in surface flatness if the value of $F_{(Sr/Ru)}$ is too large or too small. A flat surface can be accomplished by controlling film formation conditions so that $F_{(Sr/Ru)}$ may fall within the above-defined range. More illustratively, using the preparation method to be described later, $F_{(Sr/Ru)}$ can be controlled quite easily in a stable, reproducible manner. The contents of Sr and Ru can be determined by x-ray fluorescence analysis. In the psuedo-cubic perovskite structure the SRO thin film assumes, at least one of barium, calcium and rare earth elements (inclusive of Sc and Y) may partially substitute for strontium at A site, while at least one of titanium and zirconium may partially substitute for ruthenium at B site. The substitution with these elements enables to control the conductivity and work function of the conductive oxide thin film as the electrode and the lattice constant thereof as the buffer crystal, which can be utilized in optimizing the characteristics of devices using this thin film structure. It is noted that where substituent elements partially substitute for the strontium and ruthenium, the value of $F_{(Sr/Ru)}$ is calculated by converting these substituent elements into strontium and ruthenium.

In most cases, the thickness of the conductive oxide thin film is preferably about 50 nm to about 500 nm. The conductive oxide thin film should preferably be thin so that the conductivity necessary as the electrode may not be lost and the crystallinity and surface flatness may not be impeded.

Subbing thin film

In the preferred embodiment, the subbing thin film is provided between the substrate and the conductive oxide thin film. The subbing thin film is typically disposed close to the conductive oxide thin film.

The subbing thin film has a perovskite crystal structure. The perovskite structure is represented by the chemical formula: $ABO_3$ wherein A and B stand for cations. A is preferably at least one member selected from the group consisting of Ca, Ba, Sr, Pb, K, Na, Li, La, and Cd, especially Ba or Sr and B is preferably at least one member selected from the group consisting of Ti, Zr, Ta, and Nb, especially Ti. Namely, the subbing thin film is preferably formed of a composition based on barium titanate or strontium titanate, especially barium titanate.

In such perovskite type compounds, the atomic ratio A/B preferably ranges from 0.8/1 to 1.3/1, more preferably from 0.9/1 to 1.2/1. No crystallinity improvement is expected at an A/B ratio of less than 0.8 whereas an A/B ratio of more than 1.3 tends to make it difficult to form a homogeneous thin film. It is understood that the A/B ratio can be determined by x-ray fluorescence analysis. The stoichiometry of O in $ABO_3$ is not limited to 3. Some perovskite materials form a stable perovskite structure when they are in short or excess of oxygen. In $ABO_x$, x generally ranges from about 2.7 to about 3.3.

The subbing thin film preferably has (001) unidirectional orientation, that is, c-faces unidirectionally oriented parallel to the substrate surface when the crystals are tetragonal, and (100) unidirectional orientation, that is, a-faces unidirectionally oriented parallel to the substrate surface when the crystals are cubic. In either case, the subbing thin film is more preferably an epitaxial film. The preferred relationship of crystal orientation between the subbing thin film and the silicon (100) substrate is tetragonal [100]//Si [010] or cubic [010]//Si [010]. This means that the thin film and the substrate are preferably such that their axes are parallel to each other within the film plane. Such a layer structure is effective for improving the crystallinity of a conductive oxide thin film and ferroelectric thin film to be formed thereon so that they may be formed as unidirectionally oriented films and even epitaxial films. Since the subbing thin film has a good lattice matching with a conductive oxide thin film, a highly crystalline conductive oxide thin film and ferroelectric thin film are obtained thereon.

Intermediate thin film

Between the substrate and the conductive oxide thin film, an intermediate thin film is preferably provided. Where the subbing thin film is provided, it is disposed between the intermediate thin film and the conductive oxide thin film. The intermediate thin film consists of a zirconium oxide base thin film or a zirconium oxide base thin film and a rare earth oxide base thin film.

Zirconium oxide base thin film

The zirconium oxide base thin film is composed mainly of zirconium oxide or zirconium oxide stabilized with a rare earth metal element (inclusive of scandium and yttrium), that is, stabilized zirconia. The provision of this thin film prevents the overlying subbing thin film, conductive oxide thin film and ferroelectric thin film from being stripped. This thin film also presents good lattice matching with a subbing thin film of barium titanate or the like, allowing a highly crystalline conductive oxide thin film and ferroelectric thin film to be formed thereon.

The zirconium oxide or stabilized zirconium oxide is preferably of the composition: $Zr_{1-x}R_xO_{2-\delta}$ wherein R is a rare earth metal element inclusive of scandium and yttrium, x is 0 to 0.75, and δ is 0 to 0.5. R is preferably at least one member selected from the group consisting of Pr, Ce, Nd, Gd, Tb, Dy, Ho and Er while x and δ will be described later.

Desirably, the zirconium oxide base thin film has unidirectional crystal orientation. The reason is that a subbing thin film, a conductive oxide thin film and a ferroelectric thin film cannot be epitaxially grown on a thin film having a plurality of crystal faces because grain boundaries are present in such a thin film. More illustratively, the zirconium oxide base thin film is preferably of (001) unidirectional orientation when the crystals are tetragonal or monoclinic and of (100) unidirectional orientation when the crystals are cubic. In either case, the zirconium oxide base thin film should more preferably be an epitaxial film. If a zirconium oxide base thin film with such improved crystallinity can be formed, the disturbance of physical quantities by grain boundaries is eliminated and a subbing thin film, conductive oxide thin film and ferroelectric thin film of quality can be formed on the zirconium oxide base thin film.

Where an intermediate thin film ($Zr_{1-x}R_xO_{2-\delta}$) and a subbing thin film ($BaTiO_3$) are successively deposited on a silicon (100) substrate surface, the preferred crystal orientation relationship between them is $BaTiO_3$ (001)//

$Zr_{1-x}R_xO_{2-\delta}$ (001)//Si (100) and $BaTiO_3$ [100]//$Zr_{1-x}R_xO_{2-\delta}$ [100]//Si [010]. It is understood that this relationship stands when both the intermediate thin film and the subbing thin film are tetragonal. Even when the respective thin films are cubic, the same applies in the sense that axes are preferably parallel to each other within the film plane.

It is estimated from prior art examples such as YBCO that an epitaxial $BaTiO_3$ film of (001) orientation is produced as follows. Since the crystal orientation relationship required is $BaTiO_3$ (001)//$Zr_{1-x}R_xO_{2-\delta}$ (001)//Si (001) and $BaTiO_3$ [110]//$Zr_{1-x}R_xO_{2-\delta}$ [100]//Si [010], epitaxial growth would take place if a lattice matching is achieved by rotating the unit lattice of $BaTiO_3$ within c-face 45° with respect to the lattice of $Zr_{1-x}R_xO_{2-\delta}$. However, our experiment revealed it difficult to establish such a crystal orientation relationship. We have found that the desired film can be constructed with the relationship: $BaTiO_3$ (001) //$Zr_{1-x}R_xO_{2-\delta}$ (001)//Si (100) and $BaTiO_3$ [100]//$Zr_{1-x}R_xO_{2-\delta}$ [100]//Si [010].

More specifically, the $Zr_{1-x}R_xO_{2-\delta}$ and $BaTiO_3$ films have a lattice constant of 0.52 and 0.40 for a-axis, respectively. With the relationship: $BaTiO_3$ [110]//$Zr_{1-x}R_xO_{2-\delta}$ [100]//Si [010] which allows for a lattice matching by 45° in-plane rotation, the misfit amounts to 8.4%. In contrast, with the lattice matching relationship: $BaTiO_3$ [100]//$Zr_{1-x}R_xO_{2-\delta}$ [100]//Si [010] according to the invention, an a-face of $BaTiO_3$ crystal and an a-face of $Zr_{1-x}R_xO_{2-\delta}$ crystal match with each other without rotation whereupon four lattices of $BaTiO_3$ (0.4×4=1.60 nm) match with three lattices of $Zr_{1-x}R_xO_{2-\delta}$ (0.52×3=1.56 nm). At this time, the misfit is 2.6%, indicating good matching. Accordingly, the present invention has succeeded in obtaining an epitaxial $BaTiO_3$ film of (001) orientation by utilizing the relationship: $BaTiO_3$ [100]//$Zr_{1-x}R_xO_{2-\delta}$ [100]//Si [010].

$ZrO_2$ undergoes phase transition of cubic→tetragonal →monoclinic system as the temperature varies from high temperature to room temperature. Zirconium oxide having a rare earth element added thereto for stabilizing its cubic crystals is stabilized zirconia. The crystallinity of $Zr_{1-x}R_xO_{2-\delta}$ film depends on the range of x. As reported in Jpn. J. Appl. Phys., 27 (8), L1404–L1405 (1988), crystals are tetragonal or monoclinic in the compositional region where x is less than 0.2. Heretofore, epitaxial films of unidirectional orientation have been available in the cubic crystal region where x is 0.2 or more. It is noted that in the region where x is in excess of 0.75, crystals are cubic, but (100) unidirectional orientation is not available and crystals of (111) orientation are co-present. On the other hand, in the tetragonal or monoclinic region, no epitaxial films of unidirectional orientation have been available due to the introduction of undesirably oriented faces as described in J. Appl. Phys., 58 (6), 2407–2409 (1985).

Therefore, from the crystal orientation point of view, x in $Zr_{1-x}R_xO_{2-\delta}$ should preferably range from 0.2 to 0.75. The more preferred range of x is from 0.2 to 0.50. If the zirconium oxide base thin film is an epitaxial film, then it is easy for a subbing thin film, conductive oxide thin film or ferroelectric thin film to epitaxially grow thereon.

The type and amount of the rare earth metal element contained in the stabilized zirconia are selected such that the zirconium oxide base thin film may have a lattice constant which well matches with the lattice constants of the silicon substrate and a thin film to be deposited on the zirconium oxide base thin film. For example, the above-mentioned $Zr_{1-x}R_xO_{2-\delta}$ having a lattice constant of 0.52 nm is obtained when R is yttrium (Y) and x=0.3. Although the lattice constant can be changed by changing parameter x for the fixed type of rare earth element, changing parameter x only affords a narrow adjustable range for lattice constant matching. In this regard, if praseodymium (Pr) is used instead of yttrium (Y), for example, a greater lattice constant is obtainable, providing for optimum matching with $BaTiO_3$ crystals of the subbing thin film.

It is understood that zirconium oxide free of oxygen defects is represented by the chemical formula: $ZrO_2$ while the amount of oxygen in the zirconium oxide having a rare earth element added thereto varies with the type, amount and valence of the rare earth element added, so that δ in $Zr_{1-x}R_xO_{2-\delta}$ generally ranges from 0 to 0.5.

In the region of $Zr_{1-x}R_xO_{2-\delta}$ wherein x is less than 0.2, especially the high purity region of the composition wherein the proportion of zirconium in the constituent elements other than oxygen is in excess of 93 mol %, neither crystallinity nor surface flatness has been obtained as previously mentioned. As a result of our successive study, we have found that the above-mentioned unidirectional orientation and even epitaxial growth becomes possible and surface flatness is improved to a satisfactory value when the preparation method to be described later is employed. A $ZrO_2$ film of high purity has the following advantages.

As the proportion of Zr in the constituent elements excluding oxygen becomes higher, that is, as the purity of $ZrO_2$ becomes higher, the insulation resistance becomes higher and the leak current is reduced. Then a higher proportion of Zr is favorable where insulative properties are necessary. Also where $ZrO_2$ is used as an insulator in a metal-insulator-semiconductor (MIS) structure, the hysteresis of the C-V characteristic as found when yttrium-stabilized zirconia (YSZ) is used as an insulator is eliminated, offering improved interfacial properties for MIS devices. This is probably because stresses generated between the silicon substrate and the zirconium oxide base thin film due to the difference in coefficient of thermal expansion therebetween are mitigated by a phase transition of $ZrO_2$ and because $ZrO_2$ has less oxygen defects. YSZ does not act to release stresses because of the lack of phase transition and has much oxygen defects because of the rare earth element added. Also in the metal-ferroelectric-metal-insulator-semiconductor (MFMIS) and metal-ferroelectric-insulator-semiconductor (MFIS) structures, the use of $ZrO_2$ as an insulator is preferred in that the C-V hysteresis by polarization reversal of ferroelectric material is effectively achieved since the C-V hysteresis associated with the IS moiety is eliminated.

Accordingly, where satisfactory crystallinity and surface flatness are obtained, the proportion of zirconium in the constituent elements excluding oxygen is preferably in excess of 93 mol %, more preferably at least 95 mol %, further preferably at least 98 mol %, most preferably at least 99.5 mol %. The constituent elements excluding oxygen and zirconium are generally rare earth elements and phosphorus. The upper limit of the proportion of zirconium is about 99.99 mol % at the present. Since separation of $ZrO_2$ from $HfO_2$ is difficult with the currently available ultra-purifying technique, the purity of $ZrO_2$ generally indicates the purity of Zr+Hf. Therefore, the purity of $ZrO_2$ in the specification is a value calculated on the assumption that Hf and Zr are identical. However, this gives rise to no problem because $HfO_2$ serves exactly the same function as $ZrO_2$ in the zirconium oxide base thin film according to the invention.

It is noted that when an intermediate thin film is formed, oxygen in the intermediate thin film can diffuse in proximity to the surface of the silicon single crystal substrate to oxidize the substrate surface to a slight depth (for example, less than about 5 nm) to form an oxide layer of $SiO_2$ etc. Some film formation methods allow a silicon oxide layer to be left on the surface of the substrate of silicon or the like during formation of the intermediate thin film.

Rare earth oxide base thin film

When the stabilized zirconia is used as the intermediate thin film, its C-V characteristic exhibits hysteresis and in this regard, it is inferior to the high purity $ZrO_2$ film. In this case, it is possible to deprive the C-V characteristic of hysteresis by depositing a rare earth oxide base thin film on the zirconium oxide base thin film. Also depositing a rare earth oxide base thin film thereon further improves the lattice matching with the ferroelectric thin film.

The rare earth oxide base thin film is preferably constructed essentially of a rare earth oxide containing at least one member selected from the group consisting of Y, La, Ce, Pr, Nd, Sm, Eu, Gd, Tb, Dy, Ho, Er, Tm, Yb, and Lu, especially the group consisting of Ce, Pr, Nd, Gd, Tb, Dy, Ho, and Er. Where two or more rare earth elements are used, their ratio is arbitrary.

Where the rare earth oxide base thin film is stacked, the zirconium oxide base thin film may be either a film having a uniform distribution of elements or a film of the graded structure that the composition varies in a film thickness direction. In the case of the graded film, the content of rare earth element in the zirconium oxide base thin film increases gradually or stepwise and the content of zirconium decreases gradually or stepwise from the substrate side to the rare earth oxide base thin film side. Such a graded film minimizes or eliminates the misfit of lattice between the zirconium oxide base thin film and the rare earth oxide base thin film, allowing the rare earth oxide base thin film to be formed as a high crystallinity epitaxial film.

The rare earth oxide base thin film is formed on the zirconium oxide base thin film because the rare earth oxide base material alone cannot form a film of (001) or (100) unidirectional orientation, but a film of cubic (111) orientation.

The rare earth element of the rare earth oxide base thin film is preferably the same as the rare earth element added to the zirconium oxide base thin film.

Additives may be admixed in the zirconium oxide base thin film and rare earth oxide base thin film for the purpose of improving their characteristics. For example, if these thin films are doped with an alkaline earth element such as Ca and Mg, then the number of pinholes in the film can be reduced to restrain leakage. Also, aluminum and silicon are effective for lowering the resistivity of the film. Further, transition metal elements such as Mn, Fe, Co, and Ni allow the film to form therein an energy level (or trap level) due to the impurity, which can be utilized to control conductivity.

Crystallinity, surface flatness and thickness of thin films

The subbing thin film and intermediate thin film should preferably have good crystallinity and a flat surface for the purpose of improving the crystallinity of a thin film to be formed thereon.

The respective layers can be evaluated for crystallinity in terms of the half-value width of a rocking curve of reflection peak in X-ray diffractometry (XRD) and the pattern of a RHEED image. The surface flatness can be evaluated in terms of streakiness of a RHEED image and surface roughness (ten point mean roughness) as measured by AFM.

Preferably, the subbing thin film and intermediate thin film have such crystallinity that a rocking curve of reflection on a (002) face upon X-ray diffraction has a half-value width of less than 1.50°. Also preferably, the surface roughness (ten point mean roughness) Rz as measured by AFM across a reference length of 500 nm is less than 2 nm, especially less than 0.60 nm for the subbing thin film and intermediate thin film. It is desired that such a surface roughness be available over a region of at least 80%, more preferably at least 90%, especially at least 95% of the surface of each thin film. The above-described surface roughness is a value obtained by carrying out measurement at arbitrary 10 or more points evenly distributed over an area of at least 10 $cm^2$ of a thin film formed over the entire surface of the substrate.

With respect to the half-value width of a rocking curve and Rz, no particular lower limit values need be determined while smaller values are preferred. At the present, the lower limit of the half-value width of a rocking curve is about 0.4° and the lower limit of ten point mean roughness Rz across a reference length of 500 nm is about 0.10 nm.

Also, a RHEED image which is streaky and sharp indicates that the relevant thin film has improved crystallinity and surface flatness.

The thickness of the subbing thin film varies with a particular application although it is preferably 5 to 500 nm, more preferably 50 to 150 nm. The subbing thin film should preferably be thin to such an extent that its crystallinity and surface flatness are not impaired. Where the subbing thin film is used as an insulative layer, its thickness is preferably about 50 to about 500 nm.

Also the thickness of the intermediate thin film varies with a particular application although it is preferably 5 to 500 nm, more preferably 10 to 50 nm. The intermediate thin film should preferably be thin to such an extent that its crystallinity and surface flatness are not impaired. Where the intermediate thin film is used as an insulative layer, its thickness is preferably about 50 to about 500 nm. It is noted that where the intermediate thin film is of multilayer structure, the respective sub-layers should preferably have a thickness of more than 0.5 nm and the total thickness of the sub-layers should preferably fall in the above-mentioned range.

Ferroelectric thin film

A ferroelectric thin film is provided on the conductive oxide thin film. Since the underlying conductive oxide thin film has excellent surface flatness despite the formation thereof on the silicon substrate, the ferroelectric thin film at its surface can be given flatness on the molecular level independent of whether it is thick or thin.

The ferroelectric thin film formed on the conductive oxide thin film is capable of accumulating a compressive stress because the relaxation of the misfit by dislocation is unlikely to occur. Therefore, the compressive stress accumulated during film formation can be controlled to an appropriate value to cancel the influence of the silicon single crystal substrate upon cooling, enabling to form on the silicon substrate a ferroelectric thin film which is in a substantially stressless, less tensile stressed or compressive stressed state at room temperature. Therefore, the invention enables a PZT thin film to be formed even on a silicon single crystal substrate as a (001) oriented epitaxial film rather than a film of a mixture of (001) and (100) oriented crystals. Additionally, the stress control permits the ferroelectric thin film to have improved ferroelectric properties, for example, high remanent polarization.

The material used in the ferroelectric thin film is not critical and may be properly selected from ferroelectric materials. Appropriate ferroelectric materials are given below.

(A) Perovskite materials: $BaTiO_3$; lead family perovskite compounds such as $PbTiO_3$, rare earth element-containing lead titanate, PZT (lead zirconate titanate), and PLZT (lead lanthanum zirconate titanate); and bismuth family perovskite compounds. Included are simple, composite and layer perovskite compounds.

(B) Tungsten bronze materials: tungsten bronze oxides such as SBN (strontium barium niobate) and PBN (lead barium niobate).

These ferroelectric materials are described in more detail.

Among (A) perovskite materials, $BaTiO_3$ and lead family perovskite compounds such as $PbTiO_3$ are generally represented by the chemical formula $ABO_3$ wherein A and B stand for cations. A is preferably at least one member selected from the group consisting of Ca, Ba, Sr, Pb, K, Na, Li, La, and Cd, and B is preferably at least one member selected from the group consisting of Ti, Zr, Ta, and Nb. In the practice of the invention, one exhibiting ferroelectric properties at the service temperature may be properly selected from these compounds.

In such perovskite type compounds, the atomic ratio A/B preferably ranges from 0.8/1 to 1.3/1, more preferably from 0.9/1 to 1.2/1. Atomic ratios A/B in this range ensure the insulation and improve the crystallinity of dielectrics, enabling to improve dielectric and ferroelectric properties. No crystallinity improvement is expected at an A/B ratio of less than 0.8 whereas an A/B ratio of more than 1.3 tends to make it difficult to form a homogeneous thin film. Such a A/B ratio is accomplished by controlling film deposition conditions.

Although the proportion x of oxygen in $ABO_x$ is described herein as having a value of 3 as in $PbTiO_3$, the value of x is not limited to 3. Some perovskite materials form a stable perovskite structure when they are in short or excess of oxygen. In $ABO_x$, x generally ranges from about 2.7 to about 3.3. It is understood that the A/B ratio can be determined by x-ray fluorescence analysis.

The perovskite compound of $ABO_3$ type used herein may be any of $A^{1+}B^{5+}O_3$, $A^{2+}B^{4+}O_3$, $A^{3+}B^{3+}O_3$, $A_xBO_3$, $A(B'_{0.67}B''_{0.33})O_3$, $A(B'_{0.33}B''_{0.67})O_3$, $A(B^{+3}_{0.5})O_3$, $A(B^{2+}_{0.5}B^{6+}_{0.5})O_3$, $A(B^{1+}_{0.5}B^{7+}_{0.5})O_3$, $A^{3+}(B^{2+}_{0.5}B^{4+}_{0.5})O_3$, $A(B^{1+}_{0.25}B^{5+}_{0.75})O_3$, $A(B^{3+}_{0.5}B^{4+}_{0.5})O_{2.75}$, $A(B^{2+}_{0.5}B^{5+}_{0.5})O_{2.75}$, etc.

More illustratively, included are lead family perovskite compounds such as PZT and PLZT, $CaTiO_3$, $BaTiO_3$, $PbTiO_3$, $KTaO_3$, $BiFeO_3$, $NaTaO_3$, $SrTiO_3$, $CdTiO_3$, $KNbO_3$, $LiNbO_3$, $LiTaO_3$, and solid solutions thereof.

It is understood that the PZT is a solid solution of $PbZrO_3$-$PbTiO_3$. The PLZT is a compound wherein PZT is doped with lanthanum and is represented by

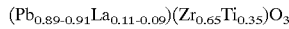

when expressed in the form of $ABO_3$.

Of the layer perovskite compounds, the bismuth family layer compounds are generally represented by the formula:

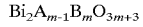

wherein m is an integer of 1 to 5, A is selected from the group consisting of Bi, Ca, Sr, Ba, Pb and rare earth elements inclusive of Sc and Y, and B is selected from the group consisting of Ti, Ta and Nb. More illustratively, $Bi_4Ti_3O_{12}$, $SrBi_2Ta_2O_9$, and $SrBi_2Nb_2O_9$ are included. In the practice of the invention, any of these compounds may be used as well as solid solutions thereof.

The preferred perovskite compounds used herein are titanates or titanate-containing perovskite compounds, for example, $BaTiO_3$, $SrTiO_3$, PLZT, PZT, $CaTiO_3$, $PbTiO_3$, and rare earth element-containing lead titanates. Preferred rare earth element-containing lead titanates are those containing R, Pb, Ti, and O wherein R is at least one rare earth element selected from the group consisting of Pr, Nd, Eu, Tb, Dy, Ho, Yb, Y, Sm, Gd, Er, and La. More preferred are PLZT, PZT, $PbTiO_3$, and rare earth element-containing lead titanates. From the standpoints of spontaneous polarization, dielectric constant, and Curie point, PZT is appropriate as memories. The invention enables the formation of PZT as an epitaxial film which was impossible in the prior art. The formation of an epitaxial film of PZT overcomes the problems of prior art, non-unidirectionally oriented, PZT thin films such as leaks and poor fatigue property of polarization reversal, and thus enables utilization of PZT's own high properties.

Preferably, the rare earth element-containing lead titanate has a composition wherein the atomic ratios of constituent elements fall in the range: $0.8 \leq (Pb+R)/Ti \leq 1.3$ and $0.5 \leq Pb/(Pb+R) \leq 0.99$ and more preferably $0.9 \leq (Pb+R)/Ti \leq 1.2$ and $0.7 \leq Pb/(Pb+R) \leq 0.97$. The rare earth element-containing lead titanate of this composition is disclosed in JP-A 186625/1996. By adding the rare earth element to $PbTiO_3$ in the above-defined ratio, the voltage (Ec) required to reverse polarization can be reduced while suppressing the reduction of remanent polarization Pr which is otherwise caused by rare earth addition. Since the rare earth element which is unlikely to form a semiconductor is added in the above-mentioned composition, there can be realized a ferroelectric thin film which is minimized in leak. We have further found that the fatigue property of polarization reversal is affected by the type and amount of the rare earth element added. Since the type and amount of the rare earth element added are selected optimum in the above-mentioned composition, there is realized a ferroelectric thin film having an improved fatigue life.

R substitutes for Pb at A site of the basic perovskite structure of $PbTiO_3$ material to deform the crystals. $PbTiO_3$ assumes a tetragonal system perovskite structure having an axis of polarization in c-axis direction. Since this crystal deformation occurs so as to reduce the ratio of a-axis to c-axis, the spontaneous polarization is slightly reduced and the voltage (Ec) necessary for polarization reversal can be lowered. In contrast, the rare earth element other than R, for example, cerium (Ce) substitutes for the element at B site of $PbTiO_3$ to achieve ineffective crystal deformation and significantly reduce the spontaneous polarization, which is undesirable for device applications.

In the rare earth element-containing lead titanate, if the ratio (Pb+R)/Ti is too low, little improvement in crystallinity is expectable. If the ratio (Pb+R)/Ti is too high, it would be difficult to form a homogeneous thin film. A ratio (Pb+R)/Ti within the above-defined range ensures satisfactory dielectric characteristics. If the ratio Pb/(Pb+R) is too low, the film would have reduced spontaneous polarization and a dielectric constant of more than 1,000. If the ratio Pb/(Pb+R) is too high, the additive effect of rare earth element for lowering Ec would become insufficient. A ratio Pb/(Pb+R) within the above-defined range is readily available by controlling the conditions under which the ferroelectric thin film is formed as will be described later. Note that the contents of Pb, Ti, and R are determined by x-ray fluorescence analysis.

In general, lead titanate contains Pb, Ti and O in an atomic ratio of Pb:Ti:O=1:1:3. In the film of the invention, the atomic ratio of oxygen can vary with the type and amount of R added and typically ranges from about 2.7 to about 3.3.

In the rare earth element-containing lead titanate, at least one of Zr, Nb, Ta, Hf and Ce may substitute for up to 60 at % of titanium.

(B) The tungsten bronze type materials are preferably those tungsten bronze type materials described in the collection of ferroelectric materials by Landoit-Borenstein, Vol. 16. Illustratively, $(Ba,Sr)Nb_2O_6$, $(Ba,Pb)Nb_2O_6$, $PbNb_2O_6$, $PbTa_2O_6$, $BaTa_2O_6$, $PbNb_4O_{11}$, $PbNb_2O_6$, $SrNb_2O_6$, and $BaNb_2O_6$ and solid solutions thereof are preferred. Especially preferred are SBN which is $(Ba,Sr)Nb_2O_6$ and PBN which is $(Ba,Pb)Nb_2O_6$.

It is desired that the ferroelectric thin film be a crystalline film whose axis of polarization is oriented in a direction perpendicular to the substrate surface. Since a ferroelectric thin film is formed on a conductive oxide thin film of quality which has been formed on a silicon substrate according to the invention, the ferroelectric thin film can be formed as an epitaxial film utilizing the stress effect of the conductive oxide thin film, accomplishing excellent ferroelectric properties. More illustratively, an epitaxial film of (001) orientation can be formed from the perovskite material, and an epitaxial film of (001) orientation can be formed from the tungsten bronze material.

More particularly, the ferroelectric thin film of perovskite material is formed on a silicon (100) surface via the intervening thin films described above. The preferred relationship of crystal axis orientation between the ferroelectric thin film and the silicon substrate is described below. It is understood that silicon has a cubic system. Where the ferroelectric thin film is (001) unidirectionally oriented, the preferred crystal axis orientation relationship is ferroelectric [100]//Si [010]. That is, in-plane axes of the ferroelectric thin film are parallel to those of the silicon substrate.

Where the ferroelectric thin film is formed from the tungsten bronze material, it is yet preferred to use a substrate having a silicon (100) surface. The preferred crystal axis orientation relationship between the ferroelectric thin film and the silicon substrate is ferroelectric [100]//Si [010].

The ferroelectric material used in the ferroelectric thin film should preferably satisfy the following conditions.

It is preferred that a compressive stress accumulate in the ferroelectric thin film at the film forming temperature owing to the misfit of crystal lattice between the ferroelectric thin film and the underlying conductive oxide thin film. To this end, the a-axis lattice constant $a_F$ of the ferroelectric material (bulk) and the in-plane lattice constant $a_S$ of the conductive oxide thin film formed on the silicon single crystal substrate satisfy the relationship:

$$1 < a_F/a_S \leq 1.04$$

at the temperature at which the ferroelectric thin film is formed. A compressive stress does not accumulate if $a_F/a_S$ is equal to or less than 1. If $a_F/a_S$ is too large, the epitaxial growth of the ferroelectric thin film becomes impossible or even when the epitaxial growth is possible, dislocation is likely to occur due to a too large misfit, preventing stresses from accumulating in the ferroelectric thin film.

Where the conductive oxide thin film is of the composition $SrRuO_3$ and the ferroelectric thin film is formed by the method to be described later, $a_S$ is equal to 0.3966 nm. Then the preferred range of $a_F$ is 0.3966 nm$<a_F \leq$0.4124 nm. In this case, it is preferable to use PZT as the ferroelectric material. PZT is a solid solution of $PbTiO_3$ and $PbZrO_3$, which are both cubic at the temperature at which the ferroelectric thin film is formed. $PbTiO_3$ has a lattice constant of 0.3968 nm and $PbZrO_3$ has a lattice constant of 0.4169 nm. Accordingly, the value of $a_F$ of PZT varies between 0.3968 nm and 0.4169 nm in accordance with the ratio of Zr to Ti. Provided that the composition of PZT is represented by $Pb(Zr_{1-x}Ti_x)O_3$, the preferred range of $a_F/a_S$ is satisfied when x is in the range: $0.23 \leq x \leq 1.00$. Where x=1, the composition becomes $PbTiO_3$.

Where x is less than about 0.4 in $Pb(Zr_{1-x}Ti_x)O_3$, bulk form materials are rhombohedral crystals and have an axis of polarization in <111> direction. However, the same materials in epitaxial thin film form do not form rhombohedral crystals, but cubic or tetragonal crystals and have an axis of polarization perpendicular to the surface of the silicon single crystal substrate. That is, the PZT epitaxial film realized by the invention has a crystal shape different from the bulk form material and an axis of polarization perpendicular to the substrate surface, which are advantageous in applications to various devices.

Although reference has been made to the combination of $SrRuO_3$ with PZT, the accumulation of compressive stress is possible in ferroelectric materials other than PZT such as rare earth-containing lead titanate because the lattice constant can be changed by partial substitution of Sr site and/or Ru site of $SrRuO_3$.

In the ferroelectric thin film in which a compressive stress has accumulated utilizing the misfit during film formation, the tensile stress produced upon cooling due to the difference in coefficient of thermal expansion between the ferroelectric thin film and the silicon single crystal substrate can be canceled, suppressing the deterioration of spontaneous polarization and also suppressing the development of a domain structure and defects. As a result, there is obtained a ferroelectric thin film which is an epitaxial film of (001) unidirecitonal orientation and has an axis of polarization perpendicular to the surface of the silicon single crystal substrate.

Desirably, the ferroelectric thin film has a thickness of up to 300 nm, preferably up to 150 nm, further preferably up to 100 nm, yet preferably up to 75 nm, most preferably up to 50 $\mu$m. To achieve excellent ferroelectric properties at room temperature, it is preferable that an in-plane compressive stress has been produced in a ferroelectric thin film during its formation. This compressive stress can be produced by the mechanism that the film accommodates the misfit by elastic distortion. If the ferroelectric thin film is too thick, the misfit cannot be accommodated by elastic distortion during epitaxial growth, but the distortion is accommodated by dislocation, failing to effectively produce a two-dimensional compressive stress in plane. However, since the invention uses the conductive oxide thin film of quality, the ferroelectric thin film can accommodate the misfit by elastic distortion, but not dislocation, even when it has a thickness in the relatively thick range. It is understood that to produce a greater compressive stress, the ferroelectric thin film is desired to be thin. However, since the development of ferroelectricity depends on the skeleton of a crystal lattice and the location of atoms, a thickness of 2 nm (corresponding to 5 lattices), preferably 5 nm is necessary at the minimum.

Also preferably, the ferroelectric thin film on the surface has a ten point mean roughness Rz of up to 10 nm, more preferably up to 5 nm across a reference length of 5,000 nm when the surface is analyzed by AFM. It is desired that such a surface roughness be available over a region of at least 80%, more preferably at least 90%, especially at least 95% of the surface of each thin film. The above-described surface roughness is a value obtained by carrying out measurement at arbitrary 10 or more points evenly distributed over an area of at least 10 $cm^2$ of a thin film formed over the entire surface of a substrate. The lower limit of Rz is not critical, with smaller values of Rz being more preferable. When the ferroelectric thin film is used to construct a memory whose capacity is proportional to the number of bits, the number of bits per unit area must be increased in order to accomplish a high capacity memory. If the ferroelectric thin film has good surface flatness, recording is possible even when the bit area is reduced. Then the improvement in surface flatness is effective for increasing the number of bits per unit area. At the present, the lower limit of Rz is about 1 nm.

Electronic device

The film structure of the invention can be worked by a semiconductor process and formed as capacitors and FET gates, constructing electronic devices of MFMIS structure such as non-volatile memories and IR sensors. It is also applicable to optical modulators, optical switches, and opto-electronic integrated circuits (OEIC). The film structure of the invention is also applicable to SQUID, Josephson devices, superconducting transistors, electromagnetic wave sensors and superconductor wired LSI utilizing superconducting thin films. When the invention is applied to the current semiconductor devices, the film structure can be utilized in the wiring of SOI devices and LSIs.

Recording medium

The film structure of the invention can also be applied to a recording medium of the type wherein information is recorded using a probe in the form of an atomic force microscope (AFM) or scanning tunneling microscope (STM). A method of recording information in a ferroelectric material using an AFM probe is disclosed in Appl. Phys. Lett., 68, 2358 (1996), for example. Information is written by applying a pulse voltage across the ferroelectric material by means of an AFM probe or the like to thereby reverse the polarization only in the probed region. The region where polarization reversal has occurred becomes a recorded bit, bearing the information. For information reading, the piezoelectric effect, pyroelectric effect, electro-optical effect and detection of current flow upon polarization reversal may be utilized. More illustratively, while an appropriate high-frequency bias voltage is applied between the recording medium and the probe, the medium is scanned with the probe. At this point, the surface of the recording medium is deformed by the piezoelectric effect of the ferroelectric thin film. Between the recorded bit region and the unrecorded region, the direction of polarization is opposite and hence, the piezoelectric effect is different. Then, a deformation corresponding to the presence of the recorded bit appears on the surface of the recording medium. This deformation is detected by the probe, thereby discriminating the recorded bit. The recorded bit may be erased as by applying a pulse voltage of opposite polarity to that used upon recording for thereby reversing the polarization.

The film structure of the invention to which such a recording and retrieving method is applied should have a FMIS construction because an electric field must be applied to the ferroelectric thin film upon recording and retrieving operation. In the practice of the invention, the conductive oxide thin film functions as a lower electrode.

The AFM or STM has a resolving power of the atomic level. Also, the ferroelectric material has a rate of polarization reversal as high as 100 ns or less and record bits can be formed to a size of less than 10 nm in diameter. The development of a memory with a high density of more than about $10^6$ megabits/cm$^2$ is thus expected. Such a high density memory will be reasonably manufactured since a ferroelectric thin film having excellent surface flatness and satisfactory ferroelectric properties is obtained according to the invention.

Preparation of conductive oxide thin film

Now it is described how to prepare the conductive oxide thin film in the film structure according to the invention.

Figure 7:
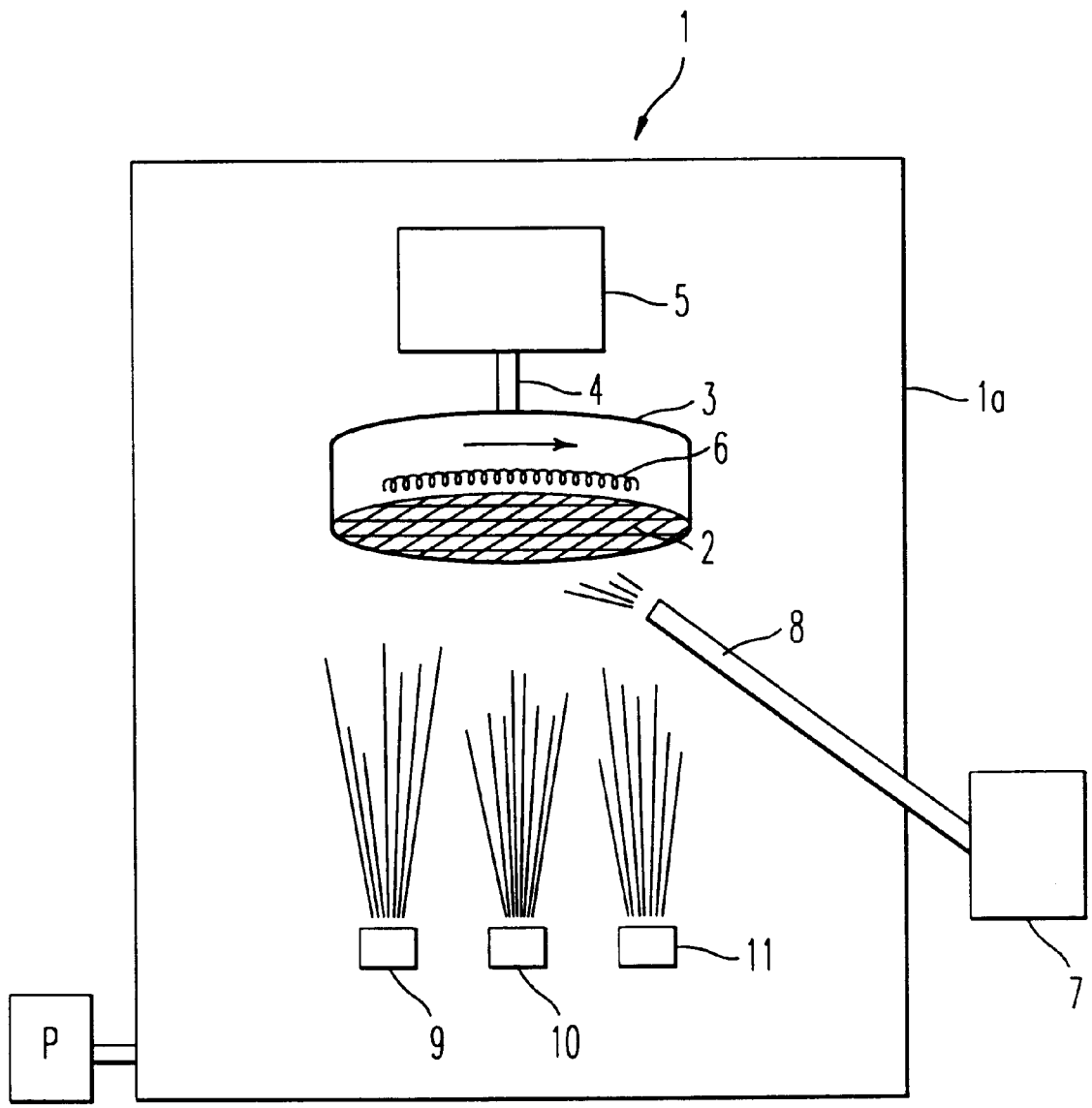
FIG. 7 schematically illustrates a vacuum chamber for use in the formation of thin films according to the invention.

In the practice of the method of the invention, an evaporation apparatus as described in FIG. 7 is preferably used.

The evaporation apparatus 1 includes a vacuum chamber 1a connected to a vacuum pump P. A holder 3 is disposed in the vacuum chamber 1a for holding a substrate 2 so that the substrate 2 may face downward. The holder 3 is connected to a motor 5 through a driving shaft 4. The motor 5 drives the holder 3 to rotate the substrate 2 within its surface. A heater 6 is built in the holder for heating the substrate 2.

The evaporation apparatus 1 further includes an oxidizing gas supply 7 with a nozzle 8 opening just below the holder 3. Then an oxidizing gas is fed such that the partial pressure of oxidizing gas is higher in proximity to the substrate 2. Disposed below the holder 3 are a first evaporation source 9 serving as a strontium source and a second evaporation source 10 serving as a ruthenium source. Each of these sources includes a source material container and means for feeding energy for evaporating the source material, e.g., an electron beam generator or resistive heater.

First of all, the substrate is set on the holder. The substrate may be one having Si (100) face at its surface, preferably a silicon single crystal substrate. Such a substrate having the aforementioned intermediate thin film and/or subbing thin film previously formed thereon is also preferably used as the substrate.

With the method of the invention used, a homogeneous conductive oxide thin film can be formed on a substrate with a large surface area, for example, of more than 10 cm$^2$. As a result, electronic devices and recording media having conductive oxide thin films can be manufactured at a considerably lower cost than in the prior art. The upper limit of the surface area of substrates is not critical although it is about 400 cm$^2$ at the present. Then the present invention can accommodate for the current semiconductor process which commonly uses silicon wafers with a diameter of 2 to 8 inches, especially 6 inches. Also a conductive oxide thin film can be formed on a selected portion of the wafer surface through a mask rather than the entire wafer surface.

Next, while the substrate is heated in vacuum, strontium and ruthenium are supplied to the substrate surface along with the oxidizing gas, thereby depositing a conductive oxide thin film. The heating temperature is preferably about 800 to 1,100° C., more preferably about 850 to 1,050° C., especially 900 to 1,000° C.

The oxidizing gas used herein may be oxygen, ozone, atomic oxygen, NO$_2$, free radical oxygen or the like. The following description refers to a typical example wherein oxygen gas is used as the oxidizing gas.

While the vacuum chamber is continuously evacuated by means of the vacuum pump, oxygen gas is continuously supplied from the source 7 into the vacuum chamber 1a. The partial pressure of oxygen in proximity to the substrate is preferably about $10^{-3}$ to $10^{-1}$ Torr. The upper limit of oxygen partial pressure is determined to be $10^{-1}$ Torr for preventing the metals in the sources in the vacuum chamber from being degraded and for maintaining the rate of evaporation of the metals constant. The preferred mode of supplying oxygen gas into the vacuum chamber is by injecting the oxygen gas toward the substrate surface from nearby so as to establish an atmosphere having a high oxygen partial pressure only in proximity to the substrate. Then reaction on the substrate can be more effectively promoted with a less feed of oxygen gas. Since the vacuum chamber is continuously evacuated, the majority of the vacuum chamber is under a low pressure of about $10^{-4}$ to $10^{-6}$ Torr. The feed rate of oxygen gas is preferably about 2 to 50 cc/min., more preferably about 5 to 25 cc/min. An appropriate feed rate of oxygen gas can be previously determined since the optimum feed rate of oxygen as depends on the volume of the vacuum chamber, the evacuation rate of the vacuum pump, and other factors.

The source materials are heated and evaporated by electron beams or other suitable means whereby the source material vapors are supplied to the substrate. The rate of deposition is preferably about 0.05 to 1.00 nm/s, more preferably about 0.100 to 0.500 nm/s. A too low deposition rate would be difficult to maintain constant and thus result in a heterogeneous film. A too high deposition rate would result in a less crystalline thin film with surface irregularities.

As previously described, the SRO thin film is improved in both surface flatness and crystallinity at a Sr/Ru ratio of about 0.94. To form a SRO thin film having a composition within the preferred range, the atomic ratio of strontium and ruthenium supplied from their sources, represented by $E_{(Sr/Ru)}$, is controlled to fall in the following range: $0.75 \leq E_{(Sr/Ru)} \leq 0.95$, more preferably $0.75 \leq E_{(Sr/Ru)} \leq 0.93$, most preferably $0.80 \leq E_{(Sr/Ru)} \leq 0.90$.

Figure 8:
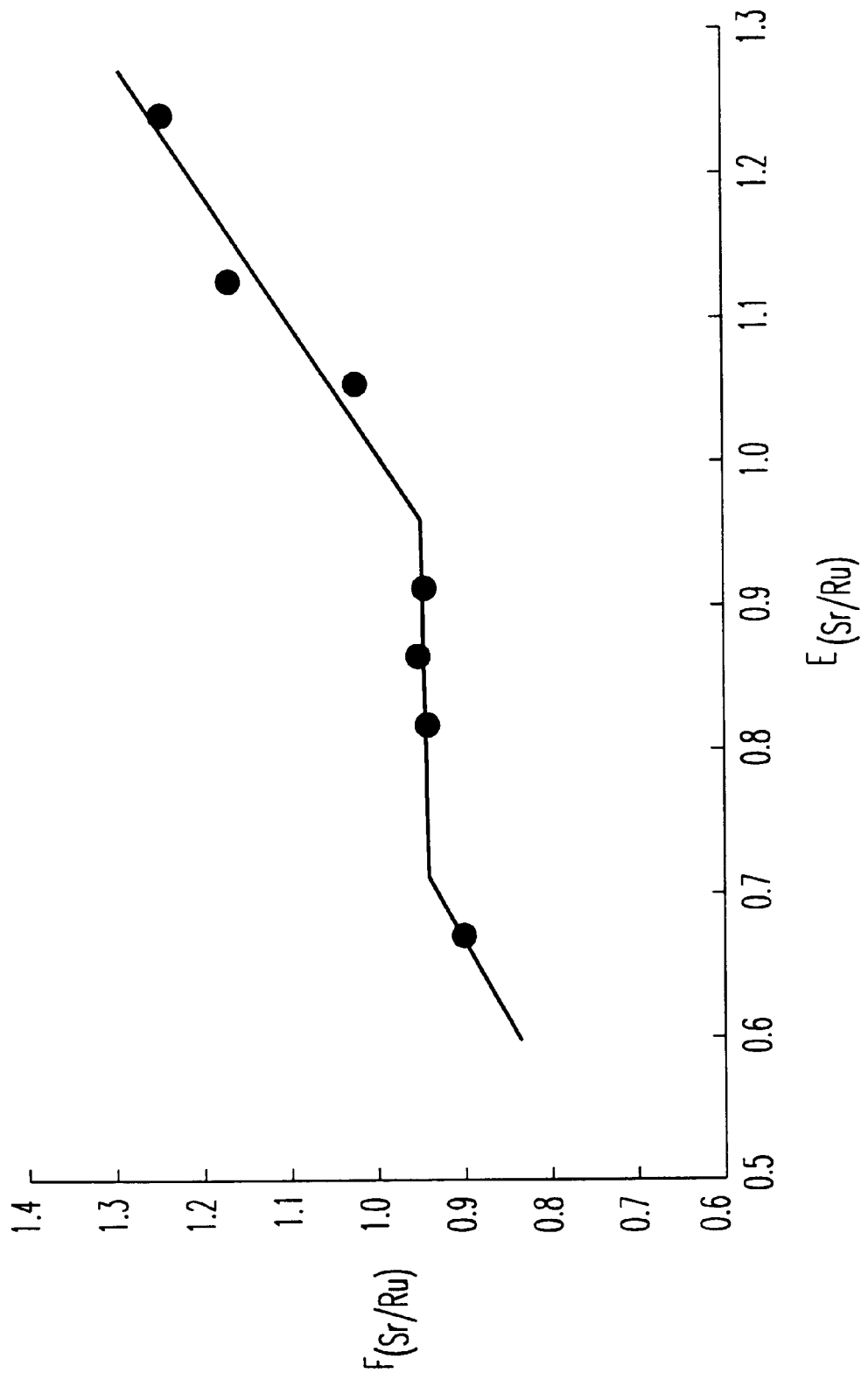
FIG. 8 is a graph showing an atomic ratio Sr/Ru, $E_{(Sr/Ru)}$, supplied from their sources relative to an atomic ratio Sr/Ru, $F_{(Sr\ Ru)}$, in the resulting SRO thin film.

FIG. 8 is a graph showing an atomic ratio Sr/Ru, $E_{(Sr/Ru)}$, supplied from their sources relative to an atomic ratio Sr/Ru, $F_{(Sr/Ru)}$, in the resulting SRO thin film. It is evident from FIG. 8 that in the $E_{(Sr/Ru)}$ range of 0.75 to 0.95, $F_{(Sr/Ru)}$ does not depend at all on changes of $E_{(Sr/Ru)}$. At this point, $F_{(Sr/Ru)}$ has a value of about 0.94 and as described above, the SRO thin film has both excellent surface flatness and crystallinity at this composition. That is, SRO is preferred in that a thin film of the preferable composition be obtained in a consistent manner. During evaporation, excessive Ru and RuOx or Ru and RuOx which are not incorporated in the crystal structure are evaporated again at the substrate surface whereupon only a SRO thin film of the perovskite structure grows on the substrate. It is noted that if $E_{(Sr/Ru)}$ is too high, the supply of sufficient ruthenium to the film is restrained so that the Sr/Ru ratio in the film may become too high, resulting in the film which fails to take the perovskite structure with high crystallinity and has insufficient surface flatness. If $E_{(Sr/Ru)}$ is too low, the Sr/Ru ratio in the film becomes too low so that a Ru-rich phase may develop and precipitate at the surface as well as the perovskite phase and the film surface becomes more rough.

As described above, by using strontium and ruthenium as the evaporation sources and setting the evaporation conditions within the predetermined range, a SRO crystal which is neither rich in nor short of ruthenium can be grown on the substrate in a self-aligning manner. The resulting SRO thin film has an atomic ratio Sr/Ru of about 0.94, and in proximity to this composition, a film surface which is flat on the molecular level is available. The inventive method is an epoch-making method for preparing a SRO crystal thin film having surface flatness on the molecular level, that ensures the formation of a SRO thin film having very high crystallinity and surface flatness.

Where the film forming area is more than about 10 cm$^2$, for example, the film is formed on the surface of a substrate having a diameter of 2 inches, oxidation reaction can be promoted over the entire film forming area by rotating the substrate and evenly supplying the oxidizing gas over the entire substrate surface as shown in FIG. 7. Then a large area, homogeneous film can be formed. In the process, the substrate is preferably rotated at 10 rpm or quicker. On slow rotation, a distribution of film thickness would occur in the substrate surface. The upper limit of revolution of the substrate is not critical although about 120 rpm is usually the upper limit because of mechanical restrictions of the vacuum apparatus.

The method for preparing the conductive oxide thin film has bee described in detail. As is apparent from a comparison with conventional methods such as vacuum evaporation, sputtering, and laser ablation methods, the method of the invention can be carried out under easily controllable conditions leaving no room of impurity inclusion. Accordingly the inventive method is suited in producing a desired thin film of completeness and a large area in a reproducible manner.

According to the inventive method, a desired thin film can be similarly produced using a molecular beam epitaxy (MBE) apparatus.

Fabrication of film structure

It is now described how to fabricate the thin films other than the conductive oxide thin film in the film structure of the invention.

The methods for forming the subbing thin film, intermediate thin film and ferroelectric thin film are not critical insofar as they can be formed as unidirectionally oriented films or epitaxial film on the silicon substrate. Preferred is evaporation, especially as disclosed in Japanese Patent Application Nos. 219850/1995, 240607/1995, and 186625/1996.

Surface treatment of substrate

Where a silicon single crystal substrate is used, the substrate is preferably surface treated prior to the formation of an intermediate thin film. The necessity of surface treatment is described below.

The surface configuration of several atom layers at the crystal surface is generally different from the atom configuration of an imaginary surface obtained when a bulk crystal (three-dimensional large crystal) structure is sectioned. Since the surrounding situation of atoms exposed at the surface is changed by the removal of crystals on one side, the exposed atoms accordingly tend to assume a stable state of lower energy. As a general rule, this structural change results in a mere relaxation of atom positions in some cases and induces atom recombination to form a rearrangement structure in other cases. The former occurs on most crystal surfaces. The latter generally forms a superlattice structure at the surface. Provided that a and b are the magnitudes of unit vectors of a bulk surface structure, if a superlattice structure having magnitudes ma and nb is created, it is referred to as a m×n structure.

In order that an oxide thin film epitaxially grow on a silicon substrate, the configuration of the silicon substrate surface must be stable and play the role of transmitting the crystal structure information to an oxide film to be grown thereon. Since the atom configuration which seems to appear when a bulk crystal structure is sectioned is a 1×1 structure, the surface configuration of a substrate on which an oxide thin film is to be epitaxially grown must be a stable 1×1 structure.

The cleaned silicon (100) surface becomes a 1×2 or 2×1 structure, and the cleaned silicon (111) surface becomes a complex superstructure having a large unit mesh of a 7×7 or 2×8 structure as will be described later. These cleaned silicon surfaces are undesirable.

Also the cleaned silicon surfaces are highly reactive and especially so at the temperature at which an oxide thin film is epitaxially formed (at least 700° C.), and tend to react with the residual gases in vacuum, typically hydrocarbons to form SiC at the surface to contaminate the substrate surface and disorder the surface crystals. In forming an oxide thin film, such a reactive silicon surface must be protected.

For this reason, the silicon single crystal substrate is preferably subject to surface treatment by the following procedure.

First, the silicon single crystal substrate with its surface cleaned is secured to the holder as shown in FIG. 1 and placed in the vacuum chamber. By heating the substrate while supplying oxidizing gas into the chamber, a silicon oxide layer is formed on the substrate surface. The oxidizing gas used herein may be selected from the same group as previously mentioned for the deposition of the conductive oxide thin film although air can also be used. The silicon oxide layer is to protect the substrate surface from rearrangement and contamination. The thickness of the silicon oxide layer is preferably about 0.2 to 10 nm. A silicon oxide layer of less than 0.2 nm thick provides insufficient protection. The reason why the upper limit is 10 nm will be described later.

The heating step is to heat the substrate to a temperature of about 300 to 700° C. at a rate of about 30 to 70° C./min. and hold it at the temperature for 0 to about 10 minutes. Too high temperatures and heating rates would lead to insufficient formation of silicon oxide layers whereas too low temperatures or too long holding time would result in too thick silicon oxide layers.

Introduction of an oxidizing gas is preferably carried out, where oxygen is used as the oxidizing gas, for example, by first evacuating the vacuum chamber to a vacuum of about $1\times10^{-7}$ to $1\times10^{-4}$ Torr and introducing the oxidizing gas to establish an atmosphere having an oxygen partial pressure of $1\times10^{-4}$ to $1\times10^{-1}$ Torr at least in the proximity of the substrate.

After the above-mentioned step, the substrate is heated in vacuum. Since the silicon crystals at the substrate surface are protected by the silicon oxide layer, any contamination, for example, formation of SiC by reaction with hydrocarbons in the residual gas is avoided. Preferably the heating temperature is about 600 to 1,200° C., especially about 700 to 1,100° C. At temperatures below 600° C., a 1×1 structure is not available on the surface of the single crystal silicon substrate. At temperatures above 1,200° C., the silicon oxide film provides insufficient protection to the silicon crystals, allowing the single crystal silicon substrate to be disordered in crystallinity.

Next, zirconium and an oxidizing gas or zirconium, a rare earth element (inclusive of Sc and Y), and an oxidizing gas are supplied to the substrate surface. In this step, the metals including zirconium function to reduce the silicon oxide layer formed in the preceding step and extinguish it. At the same time, zirconium and oxygen or zirconium, rare earth element and oxygen form a 1×1 surface structure on the thus exposed silicon crystal surface.

Figure 9A:
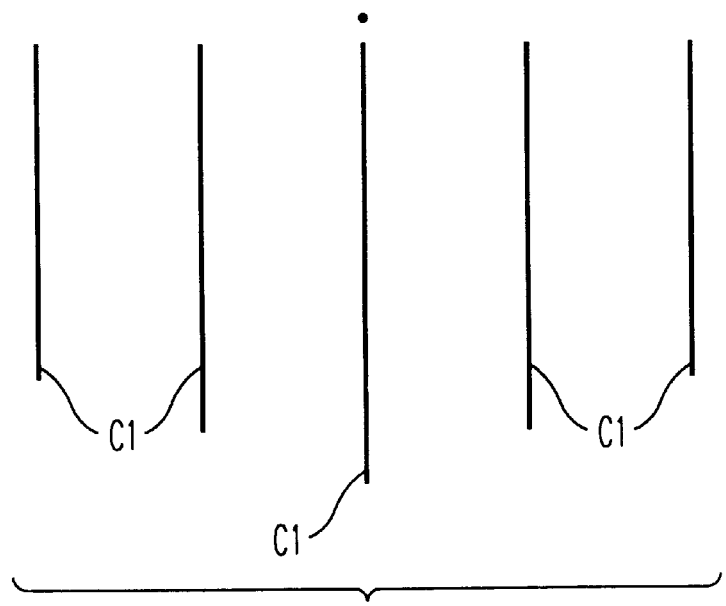
FIG. 9(*a*) is a schematic view showing a RHEED pattern of a 1×1 surface structure, and FIG. 9(*b*) is a schematic view showing a RHEED pattern of a 2×1 and/or 1×2 surface structure.
Figure 9B:
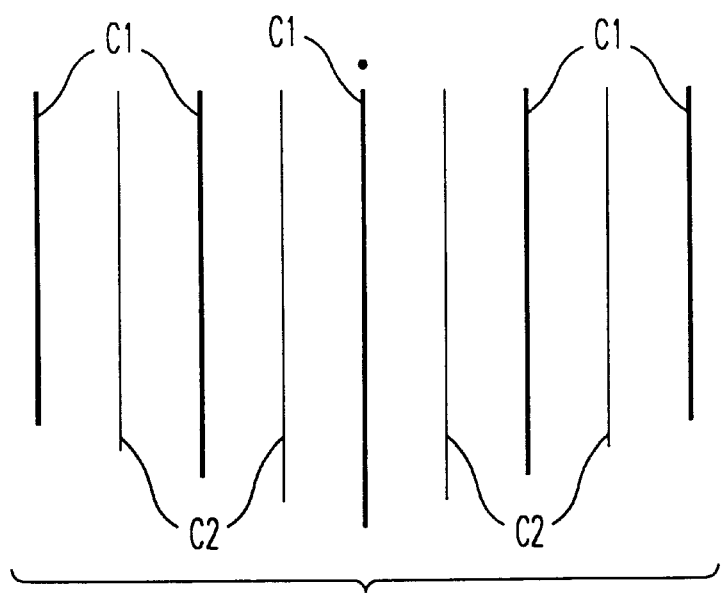

The surface structure can be examined by observing an image pattern by reflection high energy electron diffraction (RHEED). In the case of the 1×1 surface structure which is desirable in the present invention, for example, a pattern of complete streaks having a one-fold periodicity C1 as shown in FIG. 9(a) is obtained for electron beam incident direction [110]. The same pattern is obtained for incident direction [1-10]. On the other hand, the cleaned surface of silicon single crystal has a surface structure of 1×2, 2×1 or a mixture of 1×2 and 2×1 in the case of (100) face, for example. In such a case, the pattern of a RHEED image is a pattern having a one-fold periodicity C1 and a two-fold periodicity C2 as shown in FIG. 9(b) for either one or both of electron beam incident directions [110] and [1-10]. In the RHEED pattern of the 1×1 surface structure, the two-fold periodicity C2 as shown in FIG. 9(b) is not observed in both electron beam incident directions [110] and [1-10].

The cleaned silicon (100) surface sometimes shows a 1×1 structure. It was observed several times in our experiments. However, the conditions under which a 1×1 structure is available are indefinite, and it is impossible under the current circumstances to produce a 1×1 structure on the cleaned silicon surface in a consistent reproducible manner. A cleaned silicon surface whether it is of a 1×2, 2×1 or 1×1 structure is susceptible to contamination in vacuum at high temperature and especially reacts with hydrocarbons in the residual gas to form SiC on the surface, whereby the crystals on the substrate surface are disordered.

The amount of zirconium or zirconium and rare earth element fed is preferably about 0.3 to 10 nm, especially about 3 to 7 nm calculated as the thickness of an oxide film deposited when they are evaporated in an oxidizing atmosphere. Such a feed amount is expressed as nanometers calculated as oxide, hereinafter. Less than 0.3 nm calculated as oxide would not be fully effective for reducing silicon oxide. With amounts of more than 10 nm calculated as oxide, asperities as observed at the atomic level tend to develop at the surface and such asperities deprive the surface crystal arrangement of the 1×1 structure. The upper limit of the thickness of the silicon oxide layer is 10 nm because there is a possibility that the metal do not fully reduce a silicon oxide layer of thicker than 10 nm even when the metal is fed as above.

Where oxygen is used as the oxidizing gas, it is preferably fed at a rate of about 2 to 50 cc/min. The optimum amount of oxidizing gas fed is determined by the volume of the vacuum chamber, evacuation rate of the vacuum pump and other factors and it is recommended to previously determine an appropriate flow rate.

Formation of intermediate thin film

Of the intermediate thin films, the zirconium oxide base thin film is preferably formed by the method of our U.S. Ser. No. 08/516,356 which is incorporated herein by reference.

In forming a thin film composed mainly of $ZrO_2$, a silicon substrate which has been surface treated is first heated. The heating temperature for film formation is desirably higher than about 400° C. for crystallization of zirconium oxide, more desirably higher than about 750° C. for improved crystallinity, most desirably higher than about 850° C. for achieving film crystal surface flatness on the molecular level. The upper limit of the heating temperature of the single crystal substrate is about 1,300° C.

Thereafter, zirconium is heated and evaporated by electron beams or the like whereby it is supplied to the substrate surface. At the same time, an oxidizing gas and optionally, a rare earth element are supplied to the substrate surface, forming a zirconium oxide base thin film. The film deposition rate is desirably about 0.05 to 1.00 nm/s, especially about 0.100 to 0.500 nm/s for the reason that a slower rate of deposition is difficult to maintain constant whereas a faster rate results in a thin film having poor crystallinity and an irregular surface.

Various deposition conditions including the type and feed amount of oxidizing gas, oxygen partial pressure in proximity to the substrate, and revolution of the substrate are the same as mentioned for the deposition of the conductive oxide thin film.

Where a rare earth oxide base thin film is deposited on the zirconium oxide base thin film, only a rare earth element is used as the evaporation source. Conditions including the feed of oxidizing gas and substrate temperature may be the same as mentioned for the deposition of the zirconium oxide base thin film. Where the same rare earth element is used in both the thin films, the supply of zirconium is interrupted when the zirconium oxide base thin film is formed to the predetermined thickness and only the supply of rare earth metal is continued to thereby continuously form the rare earth oxide base thin film. Also when it is desired to form a zirconium oxide base thin film of a graded structure, the supply of zirconium is gradually reduced and eventually to zero before transition to the formation of the rare earth oxide base thin film.

Subbing thin film

An embodiment of forming a BaTiO$_3$ film as a subbing thin film on the intermediate thin film is described.

Subsequent to the formation of the intermediate thin film, metallic Ba and Ti are supplied to the substrate surface while heating and the supply of oxidizing gas are continued. Ba and Ti are fed in such amounts to achieve Ba:Ti=1:1. The orientation of a BaTiO$_3$ film is largely affected by the temperature of the substrate during deposition and the feed ratio of Ba/Ti at the initial of deposition. In order that the relationship of crystal orientation among the BaTiO$_3$ film, intermediate thin film ($Zr_{1-x}R_xO_{2-\delta}$), and silicon (100) substrate be BaTiO$_3$ (001)//$Zr_{1-x}R_xO_{2-\delta}$ (001)//Si (100) and BaTiO$_3$ [100]//$Zr_{1-x}R_xO_{2-\delta}$//Si [010] as previously mentioned, the heating temperature during BaTiO$_3$ film formation is desirably about 800 to 1,300° C., more desirably about 900 to 1,200° C. It is desired that the Ba/Ti feed ratio at the initial growth period be from 1 to 0, preferably from 1 to 0.8 in molar ratio. This suggests that titanium is preferably fed in excess at the initial growth period. Herein, a Ba/Ti ratio of 0 indicates that only titanium may be fed during the initial growth period. If the heating temperature is too high, the film laminate would become less crystalline due to interdiffusion. If the heating temperature is too low or if the Ba/Ti feed ratio at the initial growth period is inadequate, there would result BaTiO$_3$ having (110) orientation rather than the desired (001) orientation or a (001) oriented BaTiO$_3$ thin film having (110) orientation mixed therein. In the initial growth period, the barium supplied tends to react with the underlying zirconium oxide base thin film, retarding formation of BaTiO$_3$ of the desired orientation. Titanium is fed in excess during the initial growth period because it is desired to avoid reaction between Ba and zirconium oxide. The initial growth period is a duration passed until a film thickness of about 1 nm is reached.

Various deposition conditions associated with the deposition of the subbing thin film including the deposition rate, type and feed amount of oxidizing gas, oxygen partial pressure in proximity to the substrate, and revolution of the substrate are the same as mentioned for the deposition of the zirconium oxide base thin film.

As is apparent from a comparison with conventional methods such as vacuum evaporation, sputtering, and laser ablation methods, the methods of preparing the intermediate thin film and subbing thin film can be carried out under easily controllable conditions leaving no room for impurity inclusion. Accordingly the inventive methods are suited in producing a desired thin film of completeness and a large area in a reproducible manner. A desired thin film can be similarly produced using a MBE apparatus.

Ferroelectric thin film

The ferroelectric thin film included in the film structure of the invention may be formed by any desired method although evaporation is preferred. One illustrative forming method is described by referring to PZT as the ferroelectric material.

In the practice of the forming method, an evaporation apparatus as described in FIG. 7 is preferably used. Although the following description refers to a PZT thin film having a composition of PbTiO$_3$ plus Zr as a lead family ferroelectric thin film, thin films of other lead family ferroelectric materials can be similarly formed.

The evaporation apparatus 1 is the same as that used for the formation of the conductive oxide thin film, except that the first evaporation source 9 is a PbO source, the second evaporation source 10 is a TiOx source, and a third evaporation source 11 is a Zr source.

Lead oxide (PbO) is used as the lead source because Pb has a higher vapor pressure on a hot substrate. If elemental lead is used as a source material, Pb is evaporated again near the substrate, little depositing on the substrate. The use of PbO increases a rate of deposition. Similarly, titanium oxide (TiOx) is used as the titanium source because of an increased rate of deposition. Ti is more susceptible to oxidation than PbO. If elemental titanium is used instead of TiOx, Ti deprives the PbO of oxygen to convert the PbO into Pb, which is undesirably evaporated again near the substrate.

It is noted that in TiOx, x is preferably in the range: $1 \leq x < 1.9$, more preferably $1 \leq x < 1.8$, further preferably $1.5 \leq x < 1.75$, most preferably $1.66 \leq x < 1.75$. Upon receipt of heat energy, TiOx within this range melts and evaporates to provide a stable rate of evaporation in the vacuum chamber. In contrast, TiO$_2$ changes into TiOx upon receipt of heat energy while releasing oxygen in the vacuum chamber. This results in a significant variation of pressure in the vacuum chamber and an unstable rate of evaporation. Composition control is then difficult.

First of all, the substrate is set on the holder. The substrate used is a silicon single crystal substrate having at least the conductive oxide thin film previously formed thereon.

Next, while the substrate is heated in vacuum, PbO, TiOx and Zr are supplied to the substrate surface along with the oxidizing gas, thereby depositing a ferroelectric thin film. The heating temperature is preferably about 500 to 700° C., especially about 550 to 650° C. At temperatures of lower than 500° C., few highly crystalline ferroelectric thin films would deposit. Temperatures of higher than 700° C. would promote reaction of lead vapor with silicon of the substrate and prevent deposition of a crystalline lead family ferroelectric thin film.

The oxidizing gas used herein may be oxygen, ozone, atomic oxygen, NO$_2$, free radical oxygen or the like although it is preferred to use radical oxygen as a major or minor portion of the oxidizing gas. The following description refers to a typical example wherein radical oxygen is produced using an electron cyclotron resonance (ECR) oxygen source.

While the vacuum chamber is continuously evacuated by means of the vacuum pump, predominantly free radical oxygen gas is continuously supplied from the ECR oxygen source 7 into the vacuum chamber 1a. The partial pressure of oxygen in proximity to the substrate is preferably about $10^{-3}$ to $10^{-1}$ Torr. The upper limit of oxygen partial pressure is determined to be $10^{-1}$ Torr for preventing the metals in the sources in the vacuum chamber from being degraded and for maintaining the rate of evaporation of the metals constant. The preferred mode of supplying the oxidizing gas into the vacuum chamber is by injecting the oxidizing gas toward the substrate surface from nearby so as to establish an atmosphere having a high oxygen partial pressure only in proximity to the substrate. Then reaction on the substrate can be more effectively promoted with a less feed of oxidizing gas. Since the vacuum chamber is continuously evacuated, the majority of the vacuum chamber is under a low pressure of about $10^{-4}$ to $10^{-6}$ Torr. The feed rate of oxidizing gas is preferably about 2 to 50 cc/min., more preferably about 5 to 25 cc/min. An appropriate feed rate of oxidizing gas can be previously determined since the optimum feed rate of oxidizing gas depends on the volume of the vacuum chamber, the evacuation rate of the vacuum pump, and other factors.

The source materials are heated and evaporated by electron beams or other suitable means whereby the source material vapors are supplied to the substrate. The rate of deposition is preferably about 0.05 to 1.00 nm/s, more preferably about 0.100 to 0.500 nm/s. A too low deposition rate would be difficult to maintain constant and thus result in a heterogeneous film. A too high deposition rate would result in a less crystalline thin film with surface irregularities.

TiOx and Zr may be supplied to the substrate at evaporation rates corresponding to the desired compositional ratio since substantially the entire feed amounts of them are taken in the PZT crystal growing on the substrate. In contrast, PbO is difficult to control since it has a high vapor pressure and tends to induce a compositional deviation. As long as lead family ferroelectrics are concerned, prior art techniques have never succeeded in forming a nearly single crystal thin film free of a compositional deviation. The present invention utilizes such characteristics of PbO in an opposite sense and controls such that the amount of PbO vapor fed from its source to the substrate is in excess of the desired ratio of PbO in the PZT film crystal being formed. PbO is fed in excess such that the atomic ratio of Pb to Ti plus Zr fed from their sources, Pb/(Ti+Zr)=$E_{(Pb/Ti+Zr)}$ and the atomic ratio of Pb to Ti plus Zr in the ferroelectric thin film formed, Pb/(Ti+Zr)= $F_{(Pb/Ti+Zr)}$ may satisfy the relationship: $1.5 \leq E_{(Pb/Ti+Zr)}/F_{(Pb/Ti+Zr)} \leq 3.5$, preferably $1.7 \leq E_{(Pb,Ti+Zr)}/F_{(Pb/Ti+Zr)} \leq 2.5$, more preferably $1.9 \leq E_{(Pb/Ti+Zr)}/F_{(Pb/Ti+Zr)} \leq 2.3$. The excess of PbO, that is, the PbO which has not been incorporated in the perovskite structure is evaporated again on the substrate surface whereby only a PZT film of perovskite structure grows on the substrate. If $E_{(Pb/Ti+Zr)}/F_{(Pb/Ti+Zr)}$ is too low, an insufficient amount of Pb would be fed into the depositing film to lower the ratio of Pb/(Ti+Zr) in the film, failing to produce a highly crystalline perovskite structure. Inversely, if $E_{(Pb/Ti+Zr)}/F_{(Pb/Ti+Zr)}$ is too high, there would result a film having a too high ratio of Pb/(Ti+Zr) allowing another Pb-rich phase to develop along with the perovskite phase, failing to produce a perovskite single phase structure.

As mentioned above, the method of the invention uses PbO and TiOx as evaporation sources to increase a percent deposition, uses radical oxygen for enhancing oxidation, and heats the substrate at a temperature in the specific range, thereby allowing PZT crystals of a substantially stoichiometric composition having just enough Pb incorporated therein to grow on the substrate in a self-registering manner. The method is outstandingly prominent in that a lead family perovskite crystal thin film of stoichiometric composition, that is, a fully high crystallinity ferroelectric thin film is produced.

When the depositing surface area is more than about 10 cm², for example, when a film is deposited on a substrate with a diameter of 2 inches, the substrate is rotated as shown in FIG. 7 whereby the oxidizing gas is uniformly distributed throughout the substrate surface to promote oxidation reaction over the entire depositing surface area. This enables formation of a large surface area homogeneous film. Desirably, the substrate is rotated at about 10 rpm or higher. A lower rotational speed can result in a distribution of film thickness in the substrate plane. The upper limit of the rotational speed is not critical although it is usually about 120 rpm due to mechanical restrictions of the vacuum apparatus.

As is apparent from a comparison with conventional methods such as vacuum evaporation, sputtering, and laser ablation methods, the above-described method of preparing a ferroelectric thin film can be carried out under easily controllable conditions leaving no room of impurity inclusion. Accordingly the method is suited in producing a desired ferroelectric thin film of completeness and a large area in a reproducible manner.

According to the above-described method, a desired thin film can be similarly produced using a molecular beam epitaxy (MBE) apparatus.

There has been described a method for preparing a PZT thin film. The method is also applicable to the formation of thin films of other lead family ferroelectric materials, with equivalent results. The method is further applicable to bismuth family oxide thin films. Although in the prior art, bismuth family oxide thin films are also difficult to control their composition because of the high vapor pressure of bismuth in vacuum, the method is successful in producing bismuth family oxide thin films of quality by substituting a $Bi_2O_3$ source for the PbO source. Also in the case of the bismuth family, there is obtained ferroelectric thin film crystals of a substantially stoichiometric composition having just enough Bi incorporated therein in a self-registering manner.

In the film structure of the invention wherein the ferroelectric thin film is formed on the conductive oxide thin film having excellent surface flatness and crystallinity, the ferroelectric thin film can have a flat surface as evaluated on the molecular level even when it is as thin as 50 nm or less.

EXAMPLE

Examples of the invention are given below by way of illustration.

Example 1

As the single crystal substrate on which a conductive oxide thin film was to be grown, a silicon single crystal wafer with a diameter of 2 inches which was cut so as to make (100) face a surface and mirror polished was used. The wafer surface was cleaned by etching with a 40% aqueous solution of ammonium fluoride.

The single crystal substrate was secured to a substrate holder equipped with rotating and heating mechanisms in a vacuum chamber. The vacuum chamber was evacuated to a vacuum of $10^{-6}$ Torr by means of an oil diffusion pump. To protect the cleaned surface of the substrate with silicon oxide, the substrate was rotated at 20 rpm and heated at 600° C. while feeding oxygen toward the substrate from the nozzle at a flow rate of 25 cc/min. The substrate surface was thermally oxidized whereby a silicon oxide layer of about 1 nm thick was formed on the substrate surface.

Next, the substrate was heated at 900° C. and rotated at 20 rpm. At this point, oxygen gas was introduced from the nozzle at a flow rate of 25 cc/min. Metallic zirconium was evaporated from its source onto the substrate in an amount corresponding to a thickness of 5 nm calculated as a $ZrO_2$ film, yielding a surface treated silicon substrate having a 1×1 surface structure.

Further, while the substrate was heated at 900° C. and rotated at 20 rpm and oxygen gas was introduced from the nozzle at a flow rate of 25 cc/min., metallic zirconium was evaporated from its source onto the surface treated silicon substrate to form a $ZrO_2$ film of 10 nm thick.

Next, using the substrate having the $ZrO_2$ film borne thereon as the substrate on which evaporation was to be made, a $BaTiO_3$ film was formed thereon. Specifically, while the substrate was heated at 900° C. and rotated at 20 rpm and oxygen gas was introduced from the nozzle at a flow rate of 25 cc/min., metallic barium and metallic titanium were evaporated from their sources onto the substrate to form a $BaTiO_3$ film. At the initial stage of film formation, only titanium was fed in an amount corresponding to a thickness of 0.5 nm calculated as a $TiO_2$ film. Thereafter, titanium and barium were fed at a deposition rate of 0.05 nm/s in an amount corresponding to a thickness of 2 nm calculated as a BaTiO$_3$ film, and then the deposition rate was increased to 0.2 nm/s to form a BaTiO$_3$ film of 15 nm thick. There was obtained a Si(100)/ZrO$_2$(001) (10 nm)/BaTiO$_3$(001) epitaxial structure.

Next, using the epitaxial structure as the substrate on which evaporation was to be made, a SRO film was formed thereon. Specifically, while the substrate was heated at 950° C. and rotated at 20 rpm and oxygen gas was introduced from the nozzle at a flow rate of 25 cc/min., metallic strontium and metallic ruthenium were evaporated from their sources onto the substrate to form a SRO thin film of 100 nm thick. The supply of strontium and ruthenium from the sources was controlled so that the molar ratio of Sr/Ru became 1:1.15, that is, E$_{(Sr/Ru)}$=0.87.

On x-ray fluorescence analysis, the SRO thin film had the composition (atomic ratio): F$_{(Sr/Ru)}$=0.935.

Figure 10:
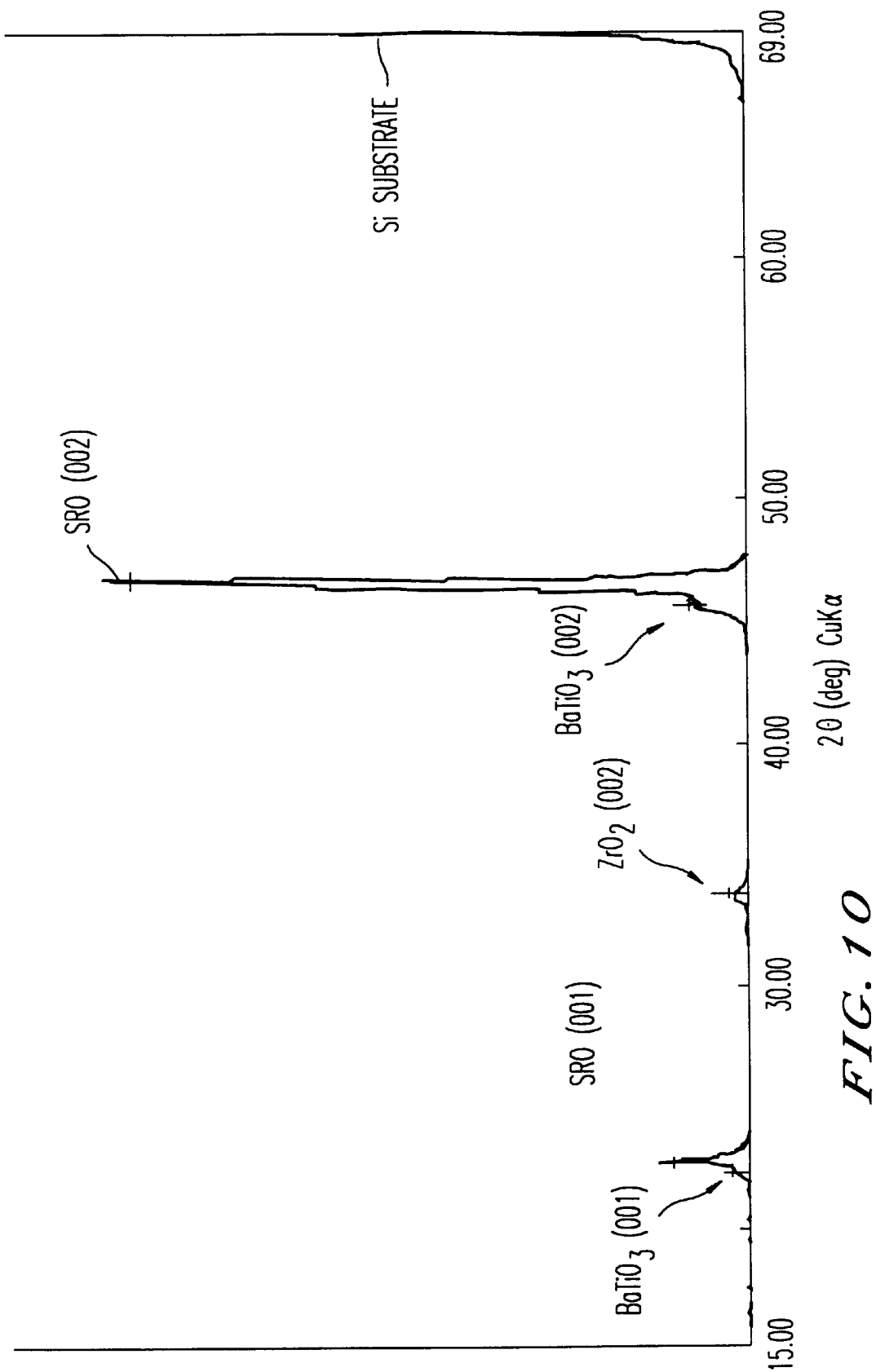
FIG. 10 is an x-ray diffraction diagram of a Si(100)/ZrO$_2$ (001) (10 nm)/BaTiO$_3$(001) (15 nm)/SRO(100 nm) structure.
Figure 11:
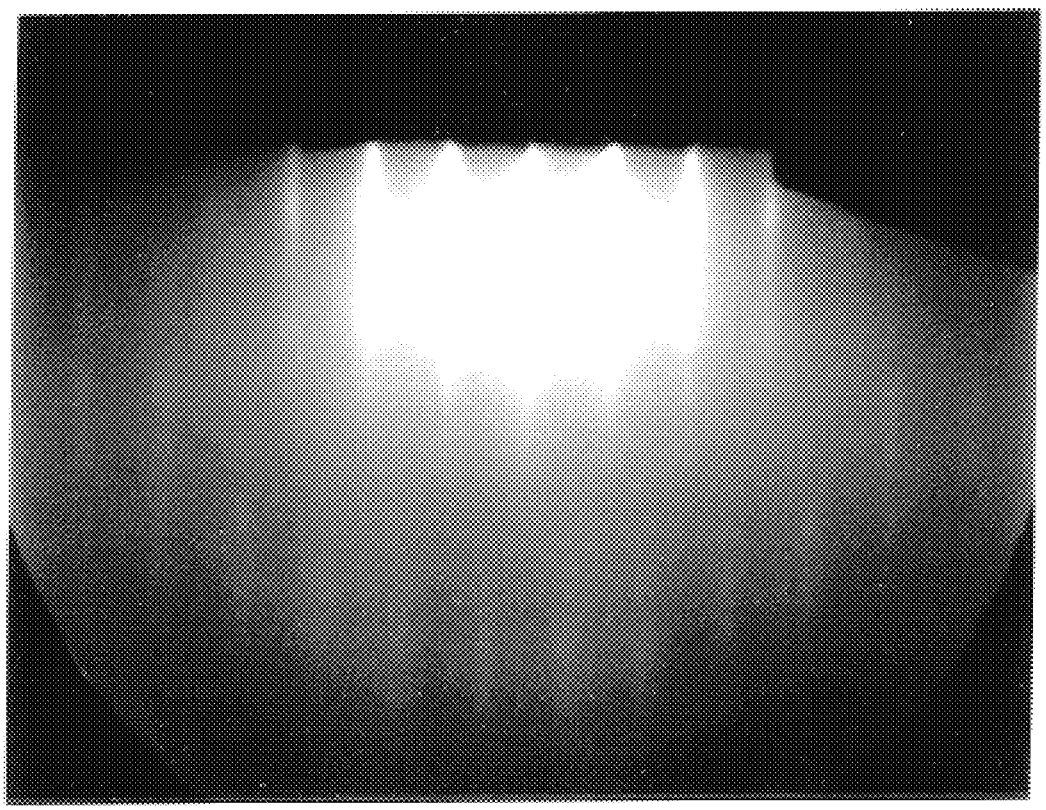
FIG. 11 illustrates a RHEED pattern of a SRO thin film formed on a Si(100)/ZrO$_2$(001) (10 nm)/BaTiO$_3$(001) (15 nm) structure, as observed when an electron beam is incident from Si [110] direction.

FIG. 10 shows an x-ray diffraction chart and FIG. 11 shows a RHEED image of the SRO thin film. Only the peak of (00 l) reflection was observed, and the rocking curve of SRO (002) reflection had a half-value width of 1.2°, confirming that the SRO thin film was a unidirectionally oriented, highly crystalline film. The diffraction pattern of the thin film surface by RHEED was a fully streaky pattern, which confirmed that the SRO thin film was an epitaxial film.

The SRO thin film was measured to have a resistivity of 4.08×10$^{-4}$ Ωcm. The SRO thin film had an in-plane lattice constant of 0.3966 nm at 600° C.

Using an AFM, the SRO thin film was further examined for surface flatness. FIG. 4 shows an AFM image of the SRO thin film surface. The film was measured for ten point mean roughness Rz across a reference length L of 5,000 nm according to JIS B0610. Rz was 4 nm on the average, 6 nm at the maximum, 2 nm at the minimum, and up to 5 nm at more than 80% of the measured points, indicating that the surface has excellent flatness. For comparison purposes, an AFM image of a SRO thin film having F$_{(Sr/Ru)}$=0.900 is shown in FIG. 3, and an AFM image of a SRO thin film having F$_{(Sr/Ru)}$=1.235 is shown in FIG. 5. A comparison of FIGS. 3 to 5 based on the density scale of FIG. 6 reveals that the surface becomes flattest when Sr/Ru is 0.935.

Next, using the epitaxial structure having the SRO thin film borne thereon as the substrate on which evaporation was to be made, a ferroelectric material PZT was evaporated to form a PZT film thereon. Specifically, the substrate was heated at 600° C. and rotated at 20 rpm. While radical oxygen gas was fed from an ECR oxygen source toward the substrate at a rate of 10 cc/min., the PbO, TiOx (wherein x=1.67), and Zr were evaporated from their sources, depositing a PZT film to the thickness shown in FIG. 13. The feed rates from the evaporation sources were controlled so as to give a molar ratio PbO:Zr:TiOx of 2:0.6:0.4, that is, E$_{(Pb/Ti+Zr)}$=2.0.

The composition (atomic ratio) of the thus formed PZT thin films was examined by x-ray fluorescence analysis, finding Pb/(Ti+Zr)=1.00 and Zr/Ti=1.503. This composition corresponds to F$_{(Pb/Ti+Zr)}$=1.00, which gives E$_{(Pb/Ti+Zr)}$/F$_{(Pb/Ti+Zr)}$=2.00.

Figure 12:
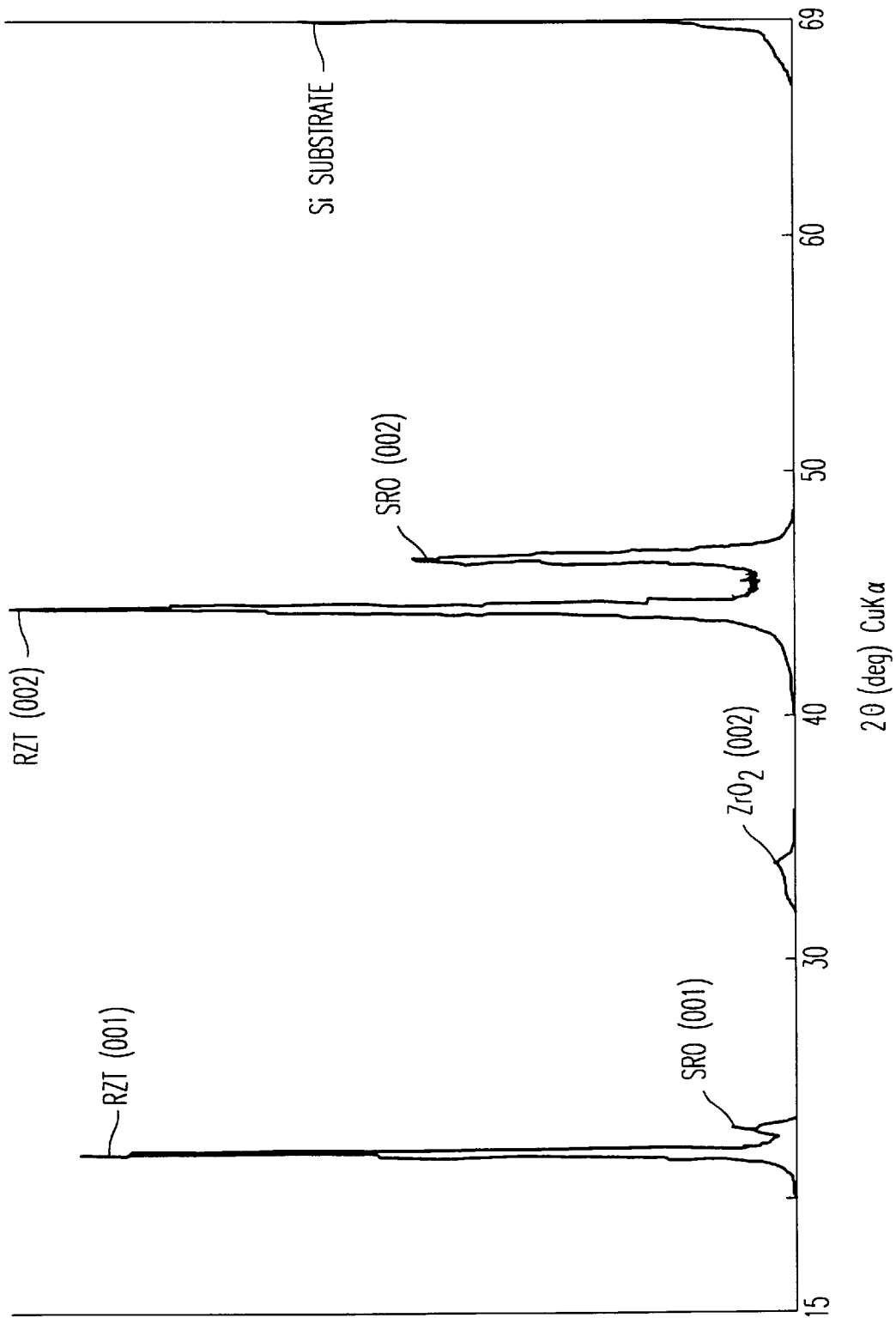
FIG. 12 is an x-ray diffraction diagram of a Si(100)/ZrO$_2$ (001) (10 nm)/BaTiO$_3$(001)(15 nm)/SRO(100 nm)/PZT(100 nm) structure.

The PZT of this composition in bulk form has a lattice constant (a$_F$) of 0.4090 nm at 600° C. whereas the SRO thin film underlying the PZT film has a lattice constant (a$_S$) of 0.3966 nm at 600° C. as previously described. These lattice constants fall in the above-defined range: 1<a$_F$/a$_S$≦1.04. RHEED and x-ray diffraction analyses confirmed that all the thin films formed on the substrate were epitaxial films of (001) orientation. The rocking curve of PZT (002) reflection had a half-value width of 1.2°, confirming that the PZT thin film was a highly crystalline film. FIG. 12 is an x-ray diffraction chart of the epitaxial structure having borne thereon the PZT film of 100 nm thick. The (200) oriented face was not detected, indicating that no domains were produced.

Figure 13:
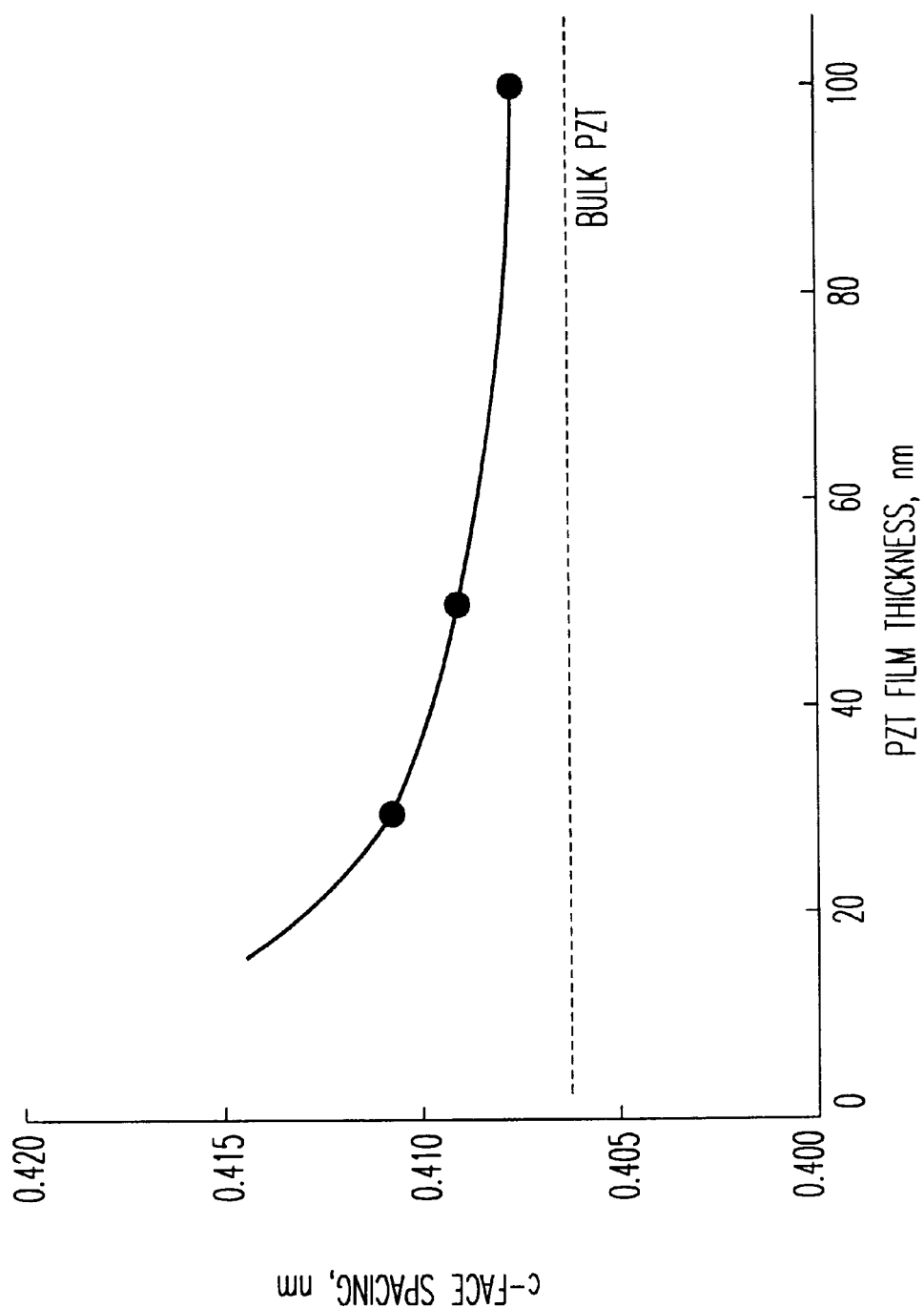
FIG. 13 is a graph showing the c-face spacing relative to thickness of a PZT film formed on a Si(100)/ZrO$_2$(001) (10 nm)/BaTiO$_3$(001) (15 nm)/SRO(001) (100 nm) substrate.

For each of the PZT films, the c-axis lattice constant (c-face spacing) was determined from the (001) face reflection in x-ray diffraction patterns. FIG. 13 shows the c-face spacing as a function of PZT film thickness. The face spacing of strainless PZT, that is, the face spacing (0.4063 nm) of bulk PZT of the same composition as the PZT films is shown by broken lines in FIG. 13.

As seen from FIG. 13, for all PZT films having a thickness of 30 nm, 50 nm and 100 nm, the c-axis of PZT films is stretched from that of the bulk PZT. The c-axis is more stretched as the film thickness decreases. This indicates that as a result of accumulation of compressive stress by the misfit, the a-axis is contracted and the c-axis is stretched.

Using an AFM, the PZT thin film was further examined for surface flatness. The film was measured for ten point mean roughness Rz across a reference length L of 5,000 nm according to JIS B0610. Rz was 5 nm on the average, 7 nm at the maximum, 2 nm at the minimum, and up to 5 nm at more than 80% of the measured points, indicating that the surface has excellent flatness.

On the surface of the PZT films of the epitaxial structures thus obtained, aluminum electrodes having a diameter of 50 μm were formed by evaporation and lithography. Leads were extended from the SRO thin films. Using a Sawyer-Tower circuit, the structures were measured for remanent polarization. The structures having the PZT film of 100 nm, 50 nm, and 30 nm thick exhibited a remanent polarization of 15 μC/cm$^2$, 20 μC/cm$^2$, and 24 μC/cm$^2$, respectively.

It is evident from these results that as the PZT film becomes thinner, the two-dimensional compressive stress built up in the PZT film during film formation increases and concomitantly, the remanent polarization after cooling to room temperature increases.

Example 2

As in Example 1, an epitaxial structure having an SRO thin film was fabricated. Using this epitaxial structure as the substrate on which evaporation was to be made, a ferroelectric material PZT was evaporated to form a PZT film thereon. Specifically, the substrate was heated at 600° C. and rotated at 20 rpm. While radical oxygen gas was fed from an ECR oxygen source toward the substrate at a rate of 10 cc/min., the PbO, TiOx (wherein x=1.67), and Zr were evaporated from their sources, depositing a PZT film of 30 nm thick and a PZT film of 100 nm thick. The feed rates from the evaporation sources were controlled so as to give a molar ratio PbO:Zr:TiOx of 2:0.25:0.75, that is, E$_{(Pb/Ti+Zr)}$=2.0.

The composition (atomic ratio) of the thus formed PZT thin films was examined by x-ray fluorescence analysis, finding Pb/(Ti+Zr)=1.00 and Zr/Ti=0.330. This composition corresponds to F$_{(Pb/Ti+Zr)}$=1.00, which gives E$_{(Pb/Ti+Zr)}$/F$_{(Pb/Ti+Zr)}$=2.00.

Figure 14:
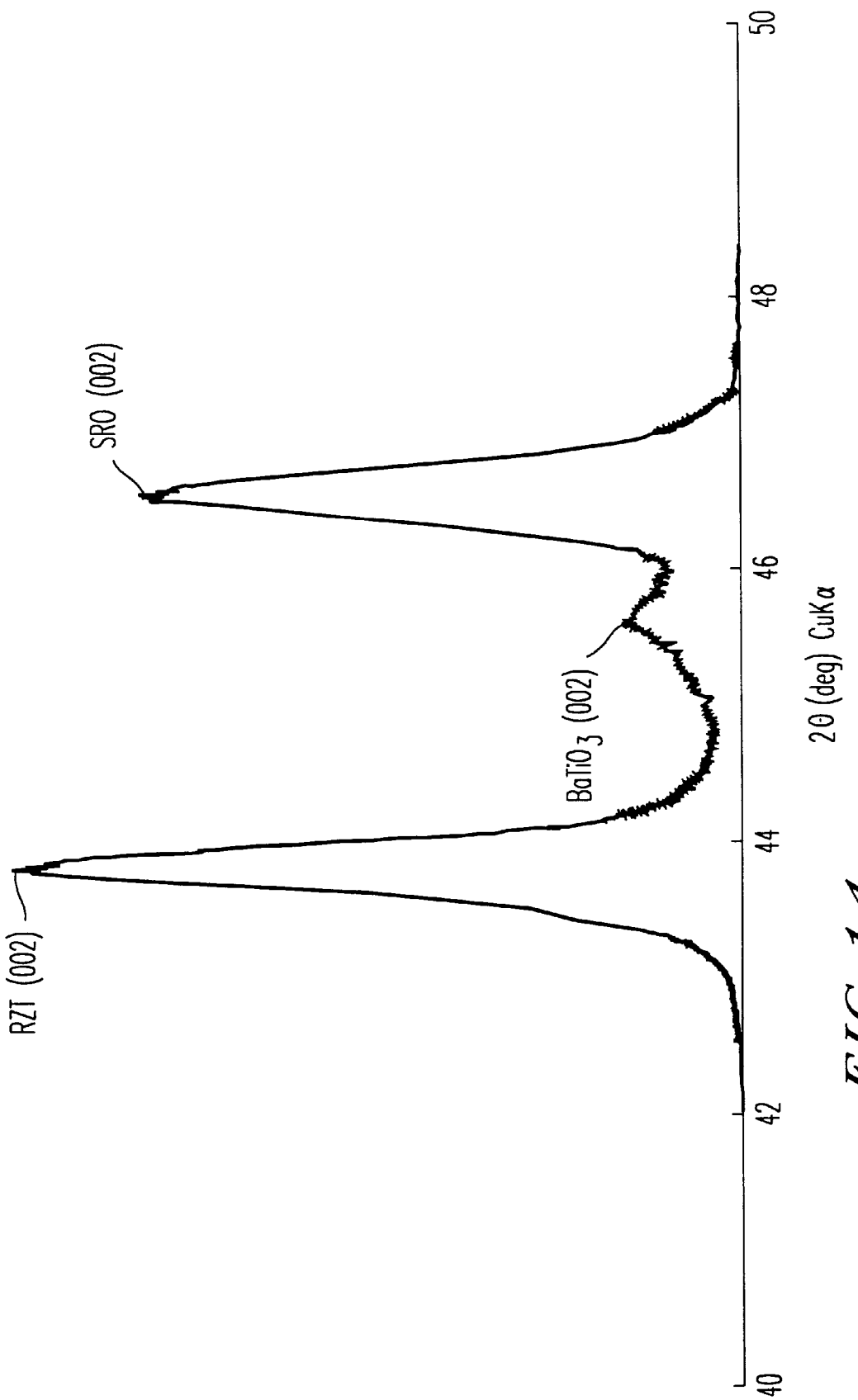
FIG. 14 is an x-ray diffraction diagram of a Si(100)/ZrO$_2$ (00l) (10 nm)/BaTiO$_3$(001) (15nm)/SRO(100 nm)/PZT(100 nm) structure.

The PZT of this composition in bulk form has a lattice constant (a$_F$) of 0.4018 nm at 600° C. whereas the SRO thin film underlying the PZT film has a lattice constant (a$_S$) of 0.3966 nm at 600° C. as previously described. These lattice constants fall in the above-defined range: 1<a$_F$/a$_S$≦1.04. On RHEED and x-ray diffraction analyses, no (100) oriented face was detected, confirming that all the thin films formed on the substrate were epitaxial films of (001) orientation. The rocking curve of PZT (002) reflection had a half-value width of 1.2°, confirming that the PZT thin film was a highly crystalline film. FIG. 14 is an x-ray diffraction chart of the epitaxial structure having borne thereon the PZT film of 100 nm thick, in proximity to PZT (002). The (200) oriented face was not detected, indicating that no domains were produced.

For each of the PZT films, the c-axis lattice constant (c-face spacing) was determined from the (001) face reflection in x-ray diffraction patterns. The c-axis of the PZT film was 0.4140 nm when it was 30 nm thick and 0.4138 nm when it was 100 nm thick. The face spacing of strainless PZT, that is, the face spacing of bulk PZT of the same composition as the PZT films is 0.4134 nm. For both the PZT films, the c-axis of PZT films is stretched from that of the bulk PZT. The c-axis is more stretched as the film thickness decreases. This indicates that as a result of accumulation of compressive stress by the misfit, the a-axis is contracted and the c-axis is stretched.

Using an AFM, the PZT thin film was further examined for surface flatness. The film was measured for ten point mean roughness Rz across a reference length L of 5,000 nm according to JIS B0610. Rz was 5 nm on the average, 7 nm at the maximum, 2 nm at the minimum, and up to 5 nm at more than 80% of the measured points, indicating that the surface has excellent flatness.

On the surface of the PZT films of the epitaxial structures thus obtained, aluminum electrodes having a diameter of 50 µm were formed by evaporation and lithography. Leads were extended from the SRO thin films. Using a Sawyer-Tower circuit, the structures were measured for remanent polarization. The structures having the PZT film of 100 nm and 30 nm thick exhibited a remanent polarization of 48 $\mu C/cm^2$ and 55 $\mu C/cm^2$, respectively. These values are deemed maximum among the remanent polarization values of heretofore available ferroelectric thin films.

It is evident from these results that as the PZT film becomes thinner, the two-dimensional compressive stress accumulated in the PZT film during film formation increases and concomitantly, the remanent polarization after cooling to room temperature increases.

The film structures fabricated in the foregoing Examples were applied to recording media as previously described. The recording/retrieval of information by means of an AFM probe was possible.

There has been described a film structure in which a conductive oxide thin film with excellent surface flatness is formed on a silicon substrate. Utilizing the conductive oxide thin film featuring surface flatness, the overlying epitaxial ferroelectric thin film can be controlled such that the crystal lattice thereof may be distorted so as to expand the spacing between crystal faces parallel to the film or be substantially free of distortion. As a result, the ferroelectric thin film is obtained as a (001) unidirectionally oriented film which does not assume the domain structure. This enables to increase the spontaneous polarization value of the ferroelectric thin film or to prevent the spontaneous polarization value from lowering, and at the same time, to improve the surface flatness of the ferroelectric thin film.

Utilizing the excellent characteristics of its ferroelectric thin film, the film structure of the invention is advantageously applied to non-volatile memories, infrared sensors, optical modulators, optical switches, OEIC and recording media. It is especially suited for gate type nonvolatile memories having a MFMIS structure and recording media adapted to record information by means of an AFM or similar probe.

The method of the invention ensures that a conductive oxide thin film having excellent surface flatness and crystallinity is formed on a silicon substrate. Under easily controllable conditions leaving no room of impurity inclusion, a conductive oxide thin film of quality can be formed over a large area having a diameter of 2 inches or more in a reproducible manner. The invention is of great industrial worth in that the conductive oxide thin film and the ferroelectric thin film can be formed on the silicon substrate which is important in semiconductor applications.

Japanese Patent Application No. 189065/1997 is incorporated herein by reference.

Although some preferred embodiments have been described, many modifications and variations may be made thereto in the light of the above teachings. It is therefore to be understood that within the scope of the appended claims, the invention may be practiced otherwise than as specifically described.

We claim:

1. A film structure comprising a substrate having a silicon (100) face at its surface and a conductive thin film of oxide formed on the substrate and having a surface, said conductive oxide thin film being an epitaxial film comprising strontium ruthenate, at least 80% of the surface of said conductive oxide thin film having a ten point mean roughness Rz of up to 10 nm across a reference length of 5,000 nm.

2. The film structure of claim 1 wherein said conductive oxide thin film contains strontium, ruthenium and oxygen, and $F_{(Sr/Ru)}$ representative of an atomic ratio Sr/Ru in the film ranges from 0.91 to 0.97.

3. The film structure of claim 1 further comprising a subbing thin film between said substrate and said conductive oxide thin film, said subbing thin film having a perovskite crystal structure and assuming (001) unidirectional orientation when it is tetragonal and (100) unidirectional orientation when it is cubic.

4. The film structure of claim 3 wherein said subbing thin film is comprising barium titanate.

5. The film structure of claim 1 further comprising an intermediate thin film between said substrate and said conductive oxide thin film, said intermediate thin film comprising a zirconium oxide base thin film which comprises zirconium oxide or zirconium oxide stabilized with a rare earth element inclusive of scandium and yttrium and assumes (001) unidirectional orientation when it is tetragonal or monoclinic and (100) unidirectional orientation when it is cubic.

6. The film structure of claim 1 further comprising a ferroelectric thin film on said conductive oxide thin film.

7. The film structure of claim 6 wherein said ferroelectric thin film is constructed of lead zirconate titanate.

8. An electronic device comprising a film structure as set forth in claim 1.

9. A recording medium comprising a film structure as set forth in claim 1.

* * * * *

UNITED STATES PATENT AND TRADEMARK OFFICE
CERTIFICATE OF CORRECTION

PATENT NO. : 6,096,434
DATED : August 1, 2000
INVENTOR(S) : Yoshihiko Yano et al Page 1 of 1

It is certified that error appears in the above-identified patent and that said Letters Patent is hereby corrected as shown below:

<u>Column 36, claim 4,</u>
Line 45, "film is comprising" should read -- film comprises --.

Signed and Sealed this

Eleventh Day of September, 2001

*Attest:*

NICHOLAS P. GODICI
*Attesting Officer*    Acting Director of the United States Patent and Trademark Office